(12) United States Patent
Okabayashi

(10) Patent No.: US 10,637,420 B2
(45) Date of Patent: Apr. 28, 2020

(54) OPERATION PANEL STRUCTURE AND CONTROL METHOD AND CONTROL APPARATUS FOR MIXING SYSTEM

(71) Applicant: Yamaha Corporation, Hamamatsu-shi, Shizuoka-ken (JP)

(72) Inventor: Masaaki Okabayashi, Hamamatsu (JP)

(73) Assignee: Yamaha Corporation, Hamamatsu-shi, Shizuoka (JP)

( * ) Notice: Subject to any disclaimer, the term of this patent is extended or adjusted under 35 U.S.C. 154(b) by 371 days.

(21) Appl. No.: 15/084,386

(22) Filed: Mar. 29, 2016

(65) Prior Publication Data

US 2016/0211933 A1    Jul. 21, 2016

Related U.S. Application Data

(60) Continuation of application No. 12/909,689, filed on Oct. 21, 2010, now Pat. No. 9,331,801, which is a
(Continued)

(30) Foreign Application Priority Data

Dec. 24, 2002 (JP) ................................. 2002-371766
Dec. 24, 2002 (JP) ................................. 2002-371779

(51) Int. Cl.
*G06F 17/00* (2019.01)
*H03G 3/02* (2006.01)
*H04H 60/04* (2008.01)

(52) U.S. Cl.
CPC .............. *H03G 3/02* (2013.01); *H04H 60/04* (2013.01)

(58) Field of Classification Search
CPC .................................. H03G 3/02; H04H 60/04
(Continued)

(56) References Cited

U.S. PATENT DOCUMENTS 4,879,751 A    11/1989  Franks et al.
5,054,077 A    10/1991  Suzuki
(Continued)

FOREIGN PATENT DOCUMENTS

EP    0 251 646 A2    1/1988
EP    0 743 766 A2    11/1996
WO    WO-99/37046    7/1999

OTHER PUBLICATIONS

Protools 5.3 Manual; Digidesign; Copyright 2002.*
(Continued)

*Primary Examiner* — Paul C McCord
(74) *Attorney, Agent, or Firm* — Morrison & Foerster LLP

(57) ABSTRACT

As viewed from the front of an operation panel, adjustment sections for individual input channels are positioned on the operation panel close to a human operator, and a display, a control section for setting an equalizer process, compressor process etc. for one selected channel and a signal delivery control section for setting signal delivery to mixing buses for the selected channel are positioned in a horizontal row remotely from the human operator. Operators in the delivery control section are varied in function in accordance with a selected operation mode. For example, in a mix send mode, a plurality of rotary operators are set to function as send level adjustment operators for the respective input channels so as to adjust send levels to a given mixing bus, while, in a mix master mode, the rotary operators are set to function as output gain adjustment operators for the respective mixing buses.

5 Claims, 10 Drawing Sheets

Related U.S. Application Data division of application No. 10/738,262, filed on Dec. 16, 2003, now Pat. No. 7,933,422.

(58) Field of Classification Search
USPC .......................................................... 700/94
See application file for complete search history.

(56) References Cited

U.S. PATENT DOCUMENTS

| | | | |
|---|---|---|---|
| 5,177,801 | A | 1/1993 | Shoda et al. |
| 5,233,666 | A | 8/1993 | Deveau |
| 5,297,211 | A | 3/1994 | Noro |
| 5,402,501 | A | 3/1995 | Silfvajt et al. |
| 5,488,669 | A | 1/1996 | Zampini et al. |
| 5,636,283 | A | 6/1997 | Hill et al. |
| 5,896,459 | A | 4/1999 | Williams, Jr. |
| 6,057,829 | A | 5/2000 | Silfvast |
| 6,061,458 | A | 5/2000 | East et al. |
| 6,674,955 | B2 | 1/2004 | Matsui et al. |
| 6,839,441 | B1 | 1/2005 | Powers et al. |
| 6,952,621 | B1 | 10/2005 | Malcolm, Jr. et al. |
| 7,308,324 | B2 | 12/2007 | Ono |
| 7,392,101 | B2 | 6/2008 | Fujita et al. |
| 7,441,193 | B1 | 10/2008 | Wild et al. |
| 7,697,703 | B2 | 4/2010 | Okabayashi et al. |
| 7,933,422 | B2 | 4/2011 | Okabayashi |
| 2001/0048291 | A1 | 12/2001 | Lautzenhiser et al. |
| 2002/0065570 | A1 | 5/2002 | Fujita et al. |
| 2002/0076073 | A1 | 6/2002 | Taenzer et al. |
| 2002/0082732 | A1 | 6/2002 | Suyama et al. |
| 2002/0107592 | A1 | 8/2002 | Craig |
| 2002/0156547 | A1 | 10/2002 | Suyama et al. |
| 2002/0188364 | A1 | 12/2002 | Ota et al. |
| 2003/0055518 | A1 | 3/2003 | Aiso et al. |
| 2003/0086580 | A1 | 5/2003 | Hamamatsu |
| 2004/0030425 | A1 | 2/2004 | Yeakel et al. |
| 2004/0131209 | A1 | 7/2004 | Okabayashi |
| 2011/0033067 | A1 | 2/2011 | Okabayashi |

OTHER PUBLICATIONS

European Communication dated Apr. 6, 2017, for EP Application No. 14182067.0, five pages.
Digidesign ProTools 5.3: available for sale and manual copyright 2003.
Digidesign Digi 002: available for sale and manual copyright 2003.
(1994). SSL 9000 J. Mixer Manual.
(2000). ID3V2 Draft Specification.
European Search Report dated Jun. 17, 2004, for EP Application No. 03104675.8, five pages.
Extended European Search Report dated Jun. 8, 2015, for EP Application No. 14182067.0, seven pages.
Final Office Action dated Jul. 23, 2012, for U.S. Appl. No. 12/909,689, filed Oct. 21, 2010, eight pages.
Final Office Action dated Nov. 29, 2013, for U.S. Appl. No. 12/909,689, filed Oct. 21, 2010, 17 pages.
Final Office Action dated Mar. 20, 2015, for U.S. Appl. No. 12/909,689, filed Oct. 21, 2010, 15 pages.
Harrison 3232 32 channel 32 bus recording console available for sale at least 1975.
Les Paul 8 Channel 8 bus recording console available for sale at least 1959.
Non-Final Office Action dated Mar. 12, 2012, for U.S. Appl. No. 12/909,689, filed Oct. 21, 2010, ten pages.
Non-Final Office Action dated May 2, 2013, for U.S. Appl. No. 12/909,689, filed Oct. 21, 2010, ten pages.
Non-Final Office Action dated Oct. 7, 2014, for U.S. Appl. No. 12/909,689, filed Oct. 21, 2010, 15 pages.
Notice of Allowance dated Dec. 30, 2015, for U.S. Appl. No. 12/909,689, filed Oct. 21, 2010, ten pages.
Partial European Search Report dated Apr. 19, 2004, for EP Application No. 03104675.8, four pages.
Yamaha DME 32: copyright 2000.
European Communication dated Feb. 15, 2018, for EP Application No. 14182067.0, four pages.
Non-Final Office Action dated Nov. 14, 2018, for U.S. Appl. No. 16/111,146, filed Aug. 23, 2018, thirteen pages.
Sony DMX R100 mixing console manual (Year: 2001).
Sony Oxford mixing console manual (Year: 1999) (Submit in two parts).
European Communication dated Jan. 29, 2019, for EP Application No. 14182067.0, four pages.
Notice of Allowance Action dated May 15, 2019, for U.S. Appl. No. 16/111,146, filed Aug. 23, 2018, nine pages.

* cited by examiner

OPERATION PANEL STRUCTURE AND CONTROL METHOD AND CONTROL APPARATUS FOR MIXING SYSTEM

CROSS-REFERENCE TO RELATED APPLICATIONS

This application is a continuation of U.S. patent application Ser. No. 12/909,689, filed on Oct. 21, 2010, which is a divisional of U.S. patent application Ser. No. 10/738,262, filed on Dec. 16, 2003, now U.S. Pat. No. 7,933,422, issued on Apr. 26, 2011, the entire disclosures of which are incorporated herein by reference.

BACKGROUND OF THE INVENTION

The present invention relates to an operation panel structure suitable for use in a mixing system having a multiplicity of monotoring signal channels, mixing system, mixing system control method and apparatus, and a computer program for mixing system control.

In recent years, the use of digital mixing systems has been getting more and more popular, particularly in commercial-use sound equipment. In a typical example of the known digital mixing systems, sound signals picked up by microphones or the like are all converted into digital signals and subjected to mixing processing in an engine composed of a DSP array, etc. Processed sound signals output from the digital mixing system include not only signals to be delivered into a concert hall or other place, but also monitoring signals to be delivered to individual human players or performers. Particularly, in an ensemble performance concert or the like, demands and requirements for the monitoring signals variously differ among the performers, so that there has been a need to supply different monitoring signals to the individual performers in accordance with the respective demands of the performers. An improved mixing system has been known which is capable of outputting monitoring signals of dozens of channels to satisfy performer-specific demands. Such an improved mixing system capable of outputting of monitoring signals of a multiplicity of channels is disclosed, for example, in "CSID Control Surface Instruction Manual", published by Yamaha Corporation, December, 2000. Another improved type of digital mixer is known, for example, from U.S. Pat. No. 5,402,501.

In the case where monitoring signals of a multiplicity of channels are to be output from the mixing system, a human operator of the mixing system has to set mixing conditions of individual monitoring signals in accordance with demands of individual performers, which often tends to be quite heavy burdens on the human operator. Therefore, it is desirable that various panel operators be positioned or arranged on a console panel surface of the mixer in such a manner as to allow the human operator to readily manipulate the panel operators; however, it can hardly be said that sufficient consideration for facilitating the manipulation of the panel operators has been made in the conventional mixer apparatus. For example, in the conventional mixer apparatus, input operators for adjusting input levels to individual mixing buses are arranged in a vertical direction (vertical rows) in the order of input channel numbers while output operators for adjusting output levels of the individual mixing buses are arranged in a horizontal direction (horizontal rows) in the order of input channel numbers, and such an operator arrangement would present the problem that the panel operators are very inconvenient to use.

SUMMARY OF THE INVENTION

In view of the foregoing, it is an object of the present invention to provide an improved operation panel structure suitable for use in a mixing system, an improved mixing system and improved mixing system control method and apparatus which permit efficient setting of mixing states or conditions of signals of a multiplicity of channels and can significantly reduce burdens on a human operator.

In order to accomplish the above-described object, the present invention provides the following novel arrangements; numerals in parentheses below indicate reference numerals representing various elements used in embodiments to be later described, for reference purposes and to facilitate understanding.

The present invention provides an operation panel structure of a mixing system including a plurality of input channels, a plurality of mixing buses (32) for mixing output signals of the individual input channels and a plurality of output channel sections (36) provided in corresponding relation to the mixing buses (32). The operation panel structure of the present invention comprises: an input channel section (500) including faders (524) for controlling attenuation rates of the individual input channels, ON/OFF switches (520) for controlling respective ON/OFF states of the individual input channels, and channel selection switches (516) for selecting any one of the input channels; a selected channel control section (300) including an equalizer section (430) for setting contents of an equalizer process for the one input channel selected via any one of the channel selection switches, a compressor section (400) for setting contents of a compressor process for the selected one input channel, and an attenuation operator (312) for setting an attenuation rate for the selected one input channel; a signal delivery control section (200) including a plurality of level operators for controlling send levels, to the plurality of mixing buses (32), of the selected one input channel, and a plurality of ON/OFF state setting operators (216) for controlling an ON/OFF state of signal delivery, to the plurality of mixing buses, of the selected one input channel; and a display (720) capable of showing a plurality of display screens including at least a screen for controlling characteristics of the individual input channels. As viewed from the front of the operation panel, the input channel section (500) is positioned on the operation panel close to a human operator, and the display (720), the selected channel control section (300) and the signal delivery control section (200) are positioned in a row and in the order mentioned remotely from the human operator.

Such an inventive operation panel structure is schematically shown, for example, in FIG. 2. Because the selected channel control section (300) is located adjacent to the display (720), contents of settings of various parameters etc., made through operation of the selected channel control section (300) can be readily visually recognized via the adjacent display (720) graphically displaying the settings, which therefore achieves enhanced convenience of use of the inventive operation panel structure. Further, because the signal delivery control section (200) is separated from and independent of the selected channel control section (300), the various operators in the signal delivery control section (200) are easy for the human operator to view and manipulate.

The present invention also provides a mixing system, which comprises: a plurality of input channel adjustment sections (30) for adjusting signals of a plurality of input channels; a plurality of mixing buses (32) for mixing output signals of the individual input channel adjustment sections (30); a plurality of output channel sections (36) provided in corresponding relation to the mixing buses (32); an input channel section including faders (524) for controlling attenuation rates of the individual input channels, ON/OFF switches (520) for controlling respective ON/OFF states of the individual input channels, and channel selection switches (516) for selecting any one of the input channels; a plurality of signal delivery control sections (200) provided in corresponding relation to the plurality of output channels, each of the signal delivery control sections including a level operator (218) for controlling a level of the corresponding output channel, an ON/OFF state setting operator (216) for controlling an ON/OFF state of the corresponding output channel, and a channel selection switch (222) for selecting the corresponding output channel; a selected channel control section (300) including an equalizer section (430) for setting contents of an equalizer process for the one input or output channel selected via any one of the channel selection switches, a compressor section (400) for setting contents of a compressor process for the selected one input or output channel, and an attenuation operator (312) for setting an attenuation rate for the selected one input or output channel; and an operation mode setting operator (202, 204) for setting the signal delivery control section to either a first operation mode or a second operation mode. When the first operation mode is selected, each of the level operators (218) is set to function as an operator for adjusting an output level from the selected channel to the mixing bus (32) corresponding to the level operator (218), and the ON/OFF state setting operator (216) corresponding to the level operator (218) is set to function as an operator for setting an ON/OFF state of signal delivery from the selected one input channel to the mixing bus (32) corresponding to the level operator (218). When the second operation mode is selected, on the other hand, each of the level operators (218) is set to function as an operator for adjusting an output level from the output channel section (36) corresponding to the level operator (218), and the ON/OFF state setting operator (216) corresponding to the level operator is set to function as an operator for setting an ON/OFF state of signal delivery from the output channel section (36) corresponding to the ON/OFF state setting operator (216).

In the inventive mixing system, the same signal delivery control section (200) is shared, in response to selection of the first operation mode or second operation mode, for control of send levels, to the mixing buses, of the individual input channels (first operation mode) and output master volume control of the output channels corresponding to the mixing buses (second operation mode). Thus, the present invention can not only significantly simplify the operation panel structure, but also allows the same operators to be shared for the send level control (first operation mode) and the output master volume control (second operation mode). As a result, the present invention allows the human operator to readily recognize correspondency between the various operators and the mixing buses, thereby achieving enhanced convenience of use of the operation panel.

According to another aspect of the present invention, there is provided a mixing system which executes an algorithm for supplying signals of a plurality of input channels to a plurality of mixing buses (32-1-32-24) and outputting a mixed result of each of the mixing buses, which comprises: an operation mode setting operator (202, 204) for setting an operation mode; and a gain adjustment operator (218) that, when a first operation mode is selected via the operation mode setting operator (202, 204), adjusts gains of signals to be supplied from one selected input channel to the plurality of mixing buses (32), while, when a second operation mode is selected via the operation mode setting operator, adjusts gains of signals to be outputted from the plurality of mixing buses.

According to still another aspect of the present invention, there is provided a mixing system control method for executing an algorithm for supplying signals of a plurality of input channels to a plurality of mixing buses (32) via corresponding input channel adjustment sections (30-1-30-24) and outputting the signals, mixed via the individual mixing buses (32), as signals of a plurality of output channels via output channel sections (36-1-36-24) corresponding to the mixing buses. The mixing system control method of the present invention comprises: a setting channel selection step of (e.g., depression of a MIX bus selection key 109-$k$ for) selecting one mixing bus (32-$k$) to be subjected to adjustment from among the plurality of mixing buses (32); a step of adjusting send levels from the individual input channel adjustment sections (30-1-30-24) to the selected one mixing bus (32-$k$), via send level adjustment operators (e.g., rotary encoders 514 in a normal mode) provided in corresponding relation to the input channels; a monitoring channel selection step of (e.g., depression of CUE keys 224, 526, etc. for) selecting, as a monitoring signal, a signal of any one of the input channel adjustment sections or the output channel sections; and an interlocking step of, when the one mixing bus (32-$k$) is selected by the setting channel selection step, selecting the signal of the output channel section (36-$k$) corresponding to the selected one mixing bus (32-$k$) in an interlocked relation to selection, by the setting channel selection step, of the one mixing bus.

According to the mixing system control method of the present invention, the signal of the output channel section (36-$k$) corresponding to the selected mixing bus (32-$k$) is selected as the monitoring signal in an interlocked relation to the selection, by the setting channel selection step of the desired mixing bus (e.g., by depression of the MIX bus selection key 109-$k$). Thus, the present invention can dispense with particular monitoring channel selection operation (e.g., operation of a CUE key), thereby simplifying necessary monitoring operation.

According to still another aspect of the present invention, there is provided a mixing system control method for executing an algorithm for supplying signals of a plurality of input channels to a plurality of mixing buses (32-1-32-24) via corresponding input channel adjustment sections (30-1-30-24) and outputting the signals, mixed via the individual mixing buses (32-1-32-24), as signals of a plurality of output channels via output channel sections (36-1-36-24) corresponding to the mixing buses. The mixing system control method of the invention comprises: an adjustment step of adjusting a frequency characteristic for one selected channel by means of a selected channel control section (300); a setting channel selection step of (e.g., depression of a SEL, key 222, 516 for) selecting a channel to be subjected to adjustment by the adjustment step, from among the input channels or the output channels; a monitoring channel selection step of (e.g., depression of a CUE key 224, 526 for) selecting, as a monitoring signal, a signal of any one of the input channel adjustment sections or the output channel sections; and an interlocking selection step of, when any one channel is selected by the monitoring channel selection step, selecting the one channel, as the channel to be subjected to the adjustment by the selected channel control section (300), in an interlocked relation to selection of the one channel by the monitoring channel selection step.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION OF THE EMBODIMENTS

1. Hardware Setup of Embodiment:

Now, a description will be made about an example general hardware setup of a mixing system in accordance with an embodiment of the present invention, with reference to FIG. 1.

Figure 1:
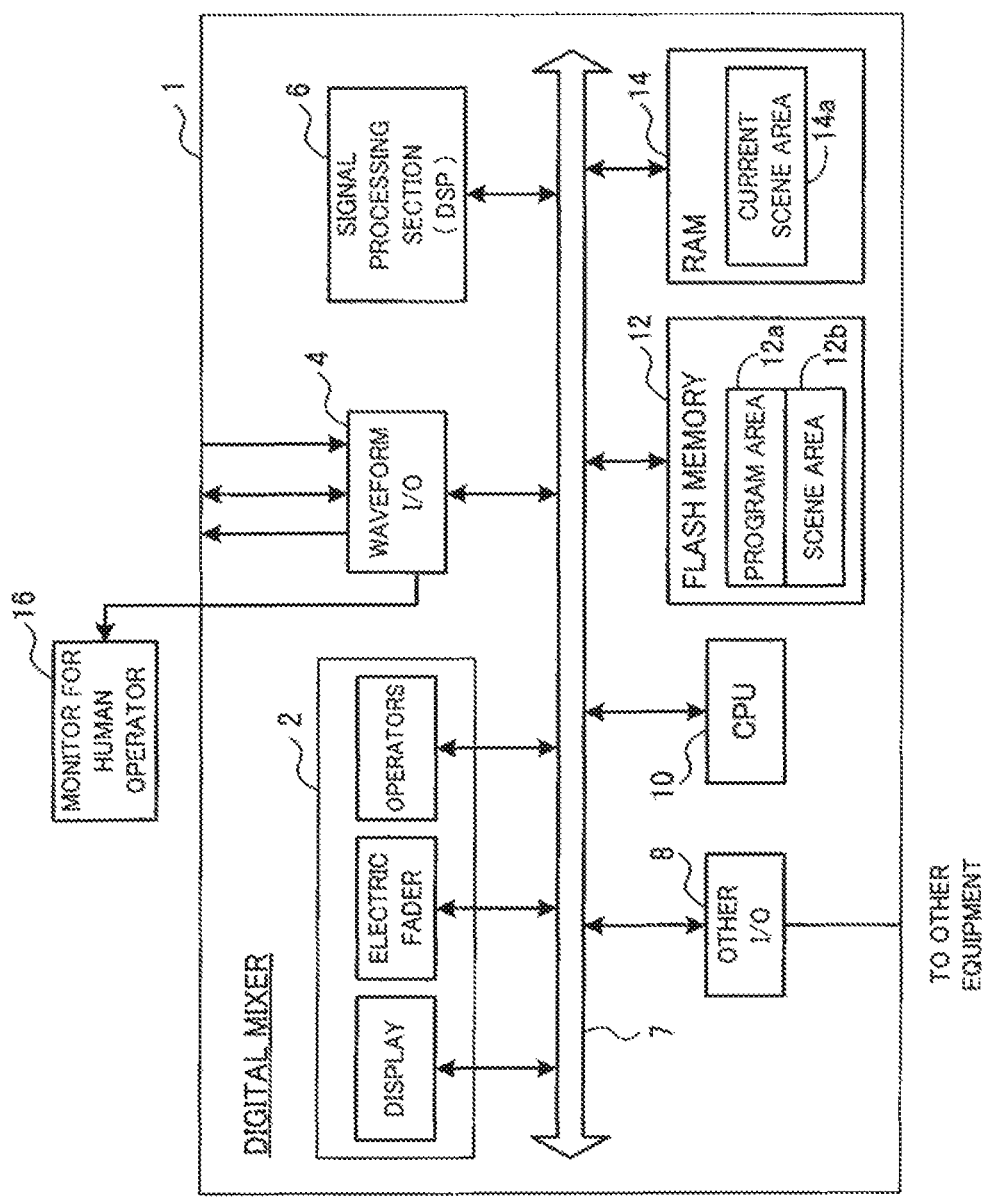
FIG. 1 is a block diagram showing a general hardware setup of a mixing system in accordance with an embodiment of the present invention.

The mixing system of FIG. 1 includes an operation panel 2, which has various displays and operators (panel operators) provided thereon. Examples of the panel operators on the operation panel 2 include a plurality of electric faders, rotary encoders, keys, etc. When any one of the electric faders has been operated by a human operator, a current operating state of the operated electric fader is output via a bus 7. Similar operations take place when any one of the rotary encoders or any one of the keys has been operated by the human operator.

When an operation command has been supplied via the bus 7 to any one of the electric faders, that electric fader is automatically set to a predetermined operating position. In contrast to the electric faders, the rotary encoder and keys are not driven automatically via an operation command. Each of the keys has an LED built therein to indicate a current ON/OFF state of the key. Display elements are provided near each of the rotary encoders for displaying an operated amount of the rotary encoder. In some cases, an illuminating state of the LED built in a particular one of the keys is set automatically via the bus 7.

Figure 7:
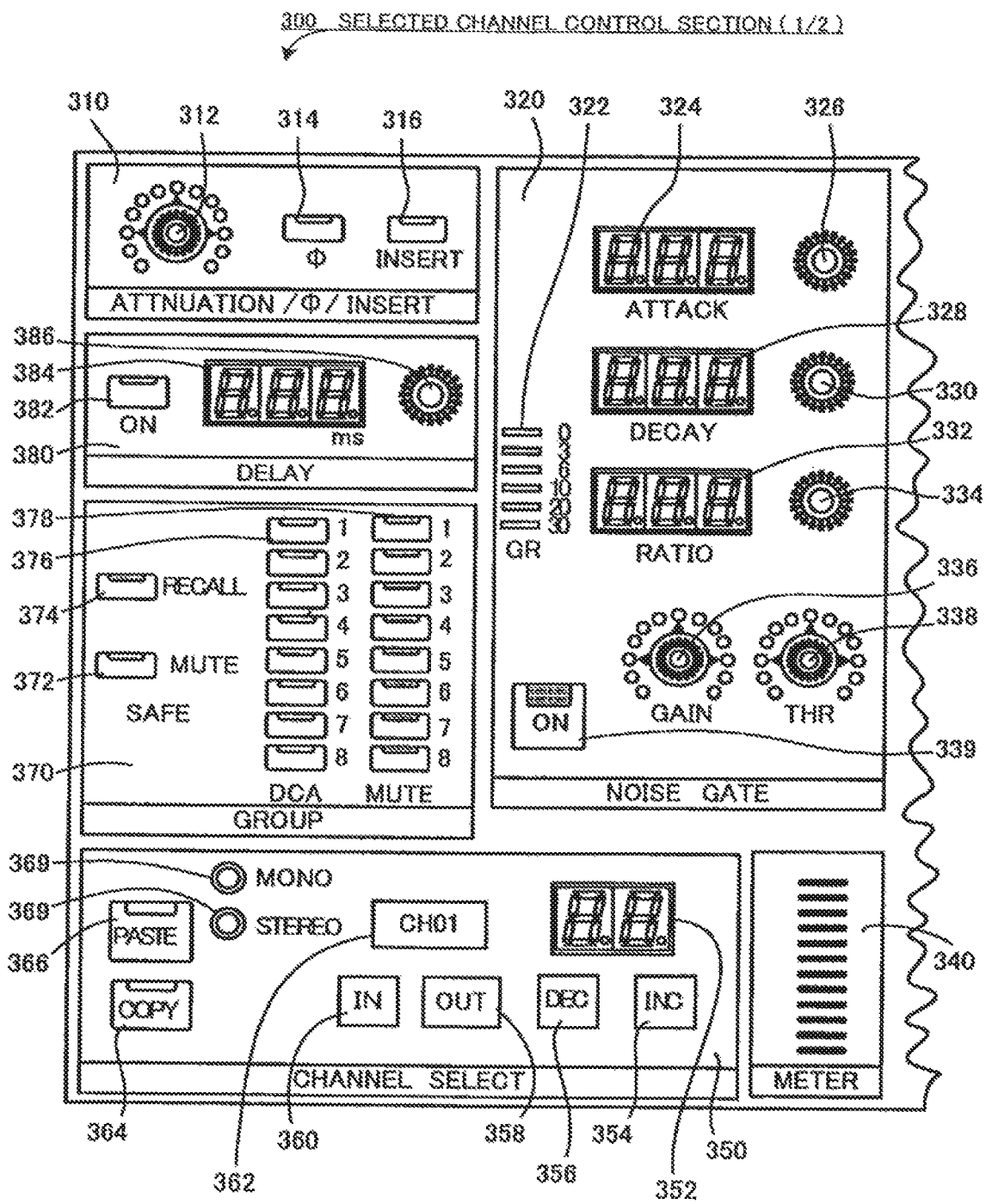
FIG. 7 is a top plan view showing an example construction of a half portion of a selected channel control section shown in FIG. 2.

The display elements provided near each of the rotary encoders may be a plurality of LEDs positioned circularly around the rotary encoder (see, for example, rotary encoder 312 of FIG. 7), or eight-segment LEDs positioned near the rotary encoder (e.g., display elements 324 corresponding to the rotary encoder 326 of FIG. 7). In each case, these display elements can automatically indicate a current operated amount of the corresponding rotary encoder. Detailed structure of the operation panel 2 will be described later.

Referring back to FIG. 1, the mixing system of FIG. 1 includes a waveform I/O section 4, which performs input/output of analog or digital sound signals. In the instant embodiment, mixing processing, effect processing, etc. of various sound signals are all carried out in a digital manner. However, in many cases, sound signals input to the mixing system from the outside and sound signals to be output to the outside are analog signals. Therefore, any desired one or more of cards having various functions are inserted, as necessary, in the waveform I/O section 4; among the various functions of the cards are microphone-level analog input, line-level analog input, digital input, analog output and digital output. Necessary conversion processes can be performed by these cards. A portion of the analog outputs can be audibly reproduced or sounded via a monitor device 16 for the human operator.

The mixing system also includes a signal processing section 6 which is in the form of a group of DSPs (Digital Signal Processors). The signal processing section 6 performs mixing processing and effect processing on digital sound signals supplied via the waveform I/O section 4, and it outputs processed results to the waveform I/O section 4. Reference numeral 8 represents another I/O section, which transmits and receives other information, such as a time code, to and from various external equipment. Note that the instant embodiment can remote-control the external equipment via the other I/O section 8. Reference numeral 10 represents a CPU, which controls various components of the mixing system via the bus 7 on the basis of control programs to be later described. Flash memory 12 includes a program area 12a where the above-mentioned control programs are stored. RAM 14 is used as a working memory for the CPU 10.

A set of settings of the mixing system corresponding to a given state of a stage or the like is called a "scene". In the instant embodiment of the mixing system, contents of a current scene is stored in a current scene area 14a of the RAM 14. The stored contents of the current scene area 14a can also be stored into a scene area 12b of the flash memory 12 or other storage device, as necessary. The scene area 12b is capable of storing contents of a plurality of scenes. Thus, at the time of a stage change, the human operator can reproduce any necessary scene in the current scene area by simple one-touch operation.

Figure 3:
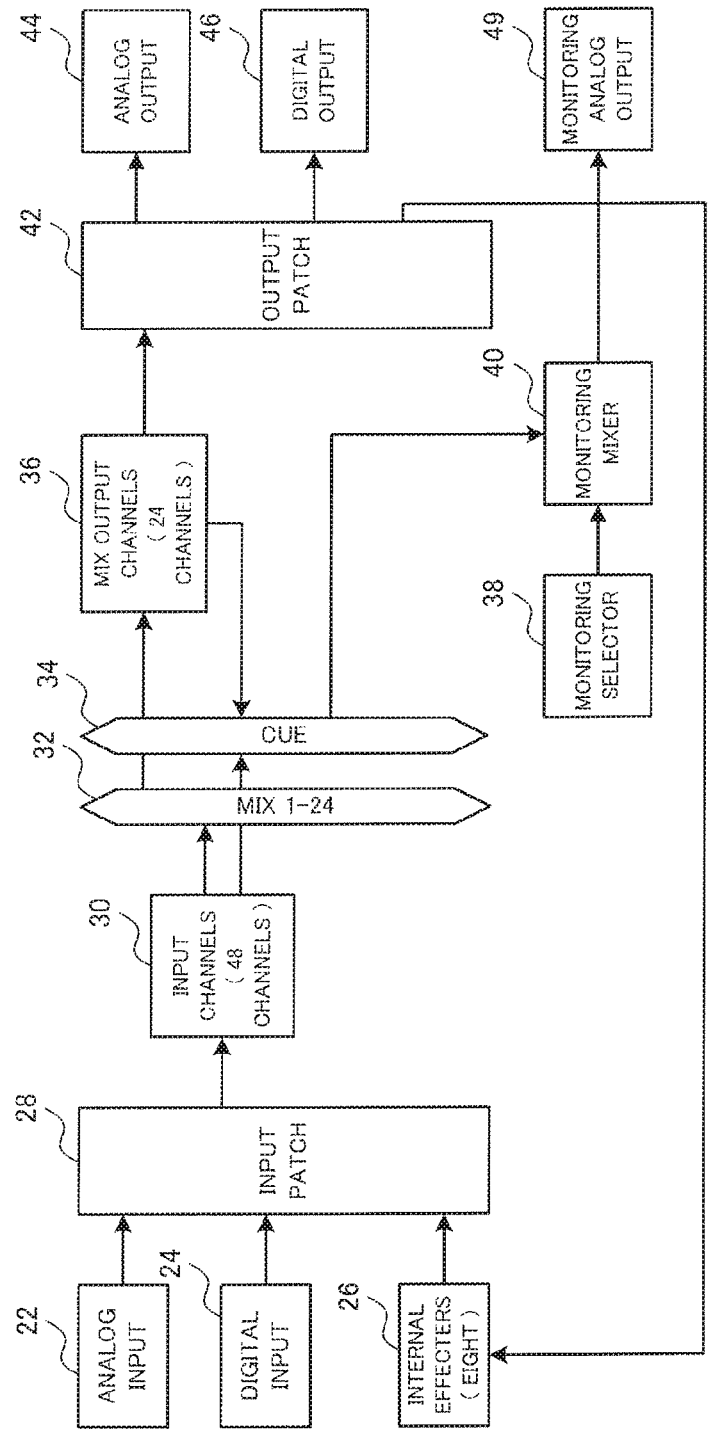
FIG. 3 is a block diagram showing an example of a mixing algorithm executed in a signal processing section etc. shown in FIG. 1.

2. Construction of Mixing Algorithm in the Embodiment:

The following paragraphs describe contents of an algorithm implemented in the signal processing section 6 etc., with reference to FIG. 3.

In FIG. 3, reference numeral 22 represents an analog input section, which, upon receipt of a microphone-level or line-level analog sound signal, converts the analog sound signal into a digital sound signal and supplies the digital sound signal to the signal processing section 6. Reference numeral 24 represents a digital input section, which, upon receipt of a digital sound signal, converts the digital sound signal into an internal format of the signal processing section 6. 44 represents an analog output section, which converts a digital sound signal, supplied from the signal processing section 6, into an analog sound signal and outputs the analog sound signal to the outside. 46 represents a digital output section, which converts a digital sound signal of the internal format, supplied from the signal processing section 6, into a digital sound signal of a predetermined format (AES/EBU, ADAT, TASCAM or the like) and outputs the thus-converted digital sound signal to the outside. Monitoring analog output section 49 converts a supplied sound signal into an analog sound signal and supplied the converted analog signal to the monitor device 16 for the human operator.

Whereas the above-described arrangements are implemented by the waveform I/O section 4, which is separate hardware from the signal processing section 6, and various cards inserted in the waveform I/O section 4, other arrangements than the above-described are implemented by programs running in the signal processing section 6. Reference numeral 30 represents input channel adjustment sections, which perform adjustment of sound volume, sound quality, etc. on up to 48 input channels on the basis of operation of the electric faders and operators provided on the operation panel 2. Input patch section 28 allocates digital sound signals, supplied via a plurality of input ports of the input sections 22 and 24, to given input channels of the input channel adjustment sections 30. Built-in internal effecter 26 performs effect processing on sound signals of up to eight channels and supplies resultant effect-processed sound signals via the input patch section 28 to the input channel adjustment sections 30.

Figure 4:
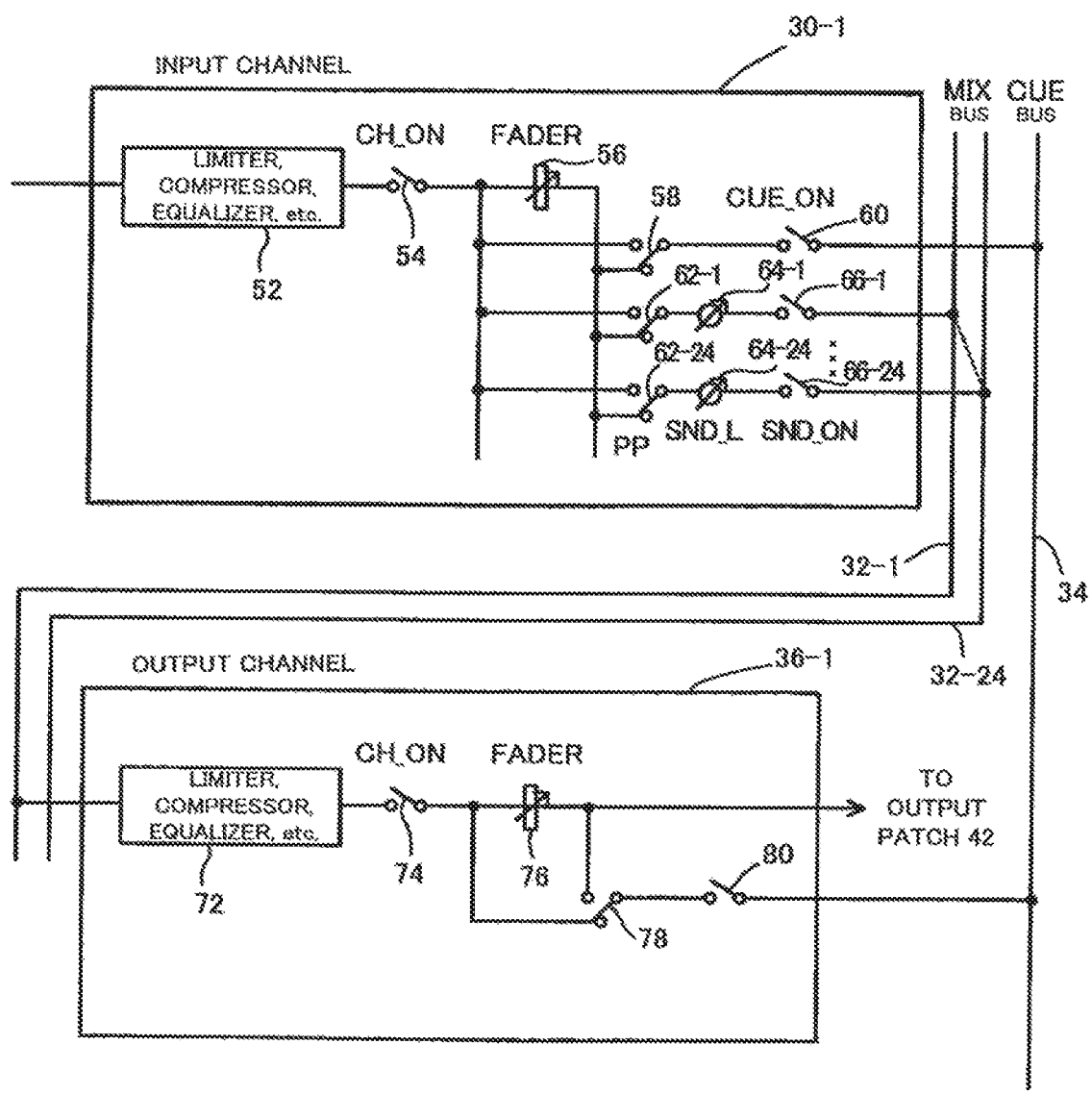
FIG. 4 is a block diagram showing principal portions of the mixing algorithm.

Reference numeral 32 represents a MIX bus group, which comprises 24 channels of MIX buses 32-1-32-24 (see FIG. 4). In each of the MIX buses 32-1-32-24, digital sound signals of the individual input channels are mixed. In each of the input channels, it can be set, for each of the MIX buses, whether or not the sound signal should be supplied to the MIX buses 32-1-32-24. If the sound signal should be supplied to the MIX buses 32-1-32-24, send (i.e., signal delivery) levels to the MIX buses 32-1-32-24 can also be set independently on the channel-by-channel basis. Reference numeral 36 represents MIX output channel sections, which perform level adjustment and sound quality adjustment on the mixed results output from these MIX buses 32-1-32-24. Output patch section 42 allocates the adjusted results of the MIX output channel sections 36 to the output sections 44 and 46 or given output ports of the internal effecter 26.

As will be later described in detail, the operation panel 2 includes CUE keys provided at various positions thereof for giving an instruction as to whether a sound signal corresponding to user's operation should be monitored. 34 represents a CUE bus, which mixes sound signals at a position where the CUE key has been turned on and outputs the mixed results as CUE signals. Monitoring selector 38 selects a monitoring position separate from the CUE bus 34. The above-mentioned CUE signals and monitoring signals selected by the monitoring selector 38 are further mixed by a monitoring mixer 40, and the mixed results of the monitoring mixer 40 are output via a monitoring analog output section 49.

Next, a description will be made about an algorithmic construction in the input channel adjustment sections 30 and MIX output channel sections 36, with reference to FIG. 4. In the figure, reference numeral 30-1 represents a first one of the input channel adjustment sections 30 (i.e., first input channel adjustment section), which performs sound quality and sound volume adjustment on the first input channel. 36-1 represents a first one of the MIX output channel sections 36 (i.e., first MIX output channel section), which performs sound quality and sound volume adjustment on the first MIX output channel.

The first channel adjustment section 30-1 includes a sound quality adjustment section 52 which performs a limiter process, compressor process, equalizer process, etc. on the first input channel, and an ON/OFF switching section 54 which switches between the ON and OFF states of the entire first input channel. When the ON/OFF switching section 54 is set in the OFF state, no sound signal is supplied to any of the MIX buses 32-1-32-24.

The first channel adjustment section 30-1 also includes a sound volume adjustment section 56 which adjusts the volume level of the first input channel. 60 represents a CUE ON/OFF switching section which determines whether or not the sound signal should be supplied to the CUE bus 34. CUE signal switching section 58 selects, as a sound signal to be output to the CUE bus 34 via the CUE ON/OFF switching section 60, one of a "pre-fade" sound signal before being subjected to the sound volume adjustment by the sound volume adjustment section 56 and a "post-fade" sound signal after having been subjected to the sound volume adjustment by the sound volume adjustment section 56.

The first input channel adjustment section 30-1 also includes MIX-bus signal switching sections 62-1-62-24, each of which selects one of the pre-fade and post-fade sound signals as a signal to be output to each of the MIX buses. Send level adjustment sections 64-1-64-24 each adjust a send level of the signal to be output to each of the corresponding MIX bus. Send ON/OFF switching sections 66-1-66-24 each turn on/off supply of the sound signal to each of the MIX buses 32-1-32-24.

The first MIX output channel section 36-1 includes a sound quality adjustment section 72, which performs a limiter process, compressor process, equalizer process, etc. on the first MIX output channel. ON/OFF switching section 74 switches between the ON and OFF states of the first MIX output channel. Sound volume adjustment section 76 adjusts an output level of a sound signal of the MIX output channel. 80 represents a CUE ON/OFF switching section which determines whether or not the sound signal of the first MIX output channel section 36-1 should be supplied to the CUE bus 34. CUE signal switching section 78 selects, as a sound signal to be output to the CUE bus 34 via the CUE ON/OFF switching section 80, one of a pre-fade sound signal and post-fade sound signal.

The preceding paragraphs have described details of the algorithmic constructions of only the first input channel adjustment section 30-1 for the first input channel and the first MIX output channel section 36-1 for the first MIX output channel. Although not specifically shown, similar input channel adjustment sections 30-2-30-24 and MIX output channel sections 36-2-36-24 are provided for the other input channels and MIX output channels.

Figure 2:
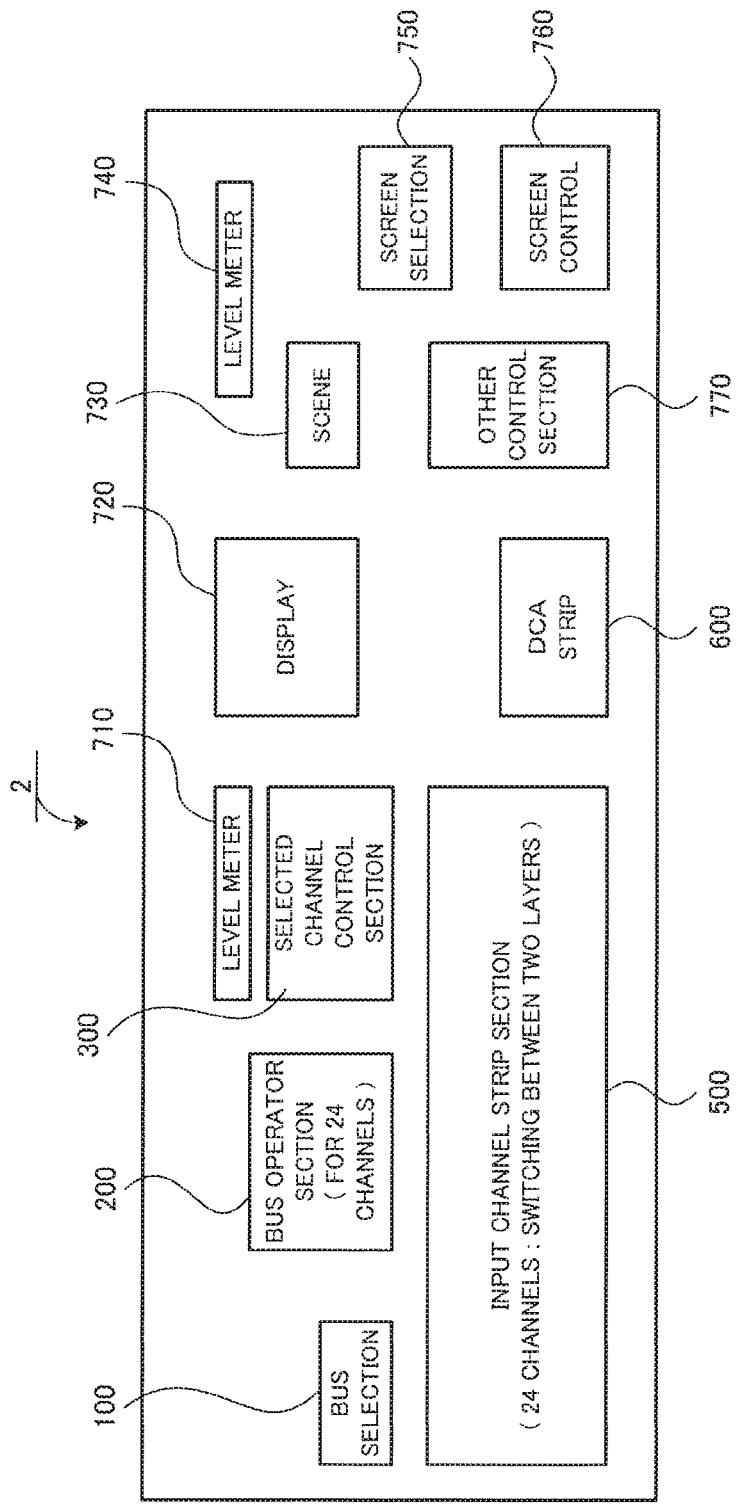
FIG. 2 is a schematic top plan view showing an overall appearance of an operation panel employed in the mixing system of FIG. 1.

3. Construction of the Operation Panel 2:

Now, an exemplary general setup of the operation panel 2 will be described with reference to FIG. 2. As shown in the top plan view of FIG. 2, the operation panel 2 includes a bus selection section 100, which includes operators for selecting any one of the MIX buses 32-1-32-24, etc. Bus operator section 200 includes operators for setting send levels with which signals of the individual input channels are to be sent to the MIX bus selected by the bus selection section 100, levels of the individual sound volume adjustment sections 76 in the MIX output channel sections 36, etc. Selected channel control section 300 includes operators for making specific settings of the sound quality adjustment section 52 or 72 for a selected one of the input channels or MIX output channels.

The operation panel 2 includes an input channel strip section 500, which includes a plurality of faders corresponding to the input-channel sound volume adjustment sections 56, operators pertaining to the input channel adjustment sections 30, etc. Assigned channel strip section 600, which includes faders and other operators, performs operations corresponding to a function assigned thereto, such as input-channel sound volume adjustment, MIX-output-channel sound volume adjustment or DAC-group sound volume adjustment (to be later described). Level meters 710 and 740 display levels of an input channel, MIX output channels, etc.

Reference numeral 720 represents a graphic display, which displays graphs of various characteristics etc. while the selected channel control section 300 are making settings for a limiter process, compressor process, equalizer process, etc. Reference numeral 730 represents a scene selection section, which allows the human operator to perform various operation, such as one for transferring stored contents of the current scene area 14a to the scene area 12b and one for reproducing a scene, already stored in the scene area 12b, in the current scene area 14a.

Reference numeral 750 represents a screen selection section, which controls a screen to be displayed on the display section 720. Displayed contents of the display 720 can be set, for example, to a compressor characteristic screen or equalizer characteristic screen when the human operator wants to make settings for the compressor process or equalizer process of the sound quality adjustment section 52, 72 or the like in the selected channel control section 300. 760 represents a screen control section, which includes cursor keys for moving a cursor shown on the display 720, pointing device, data inputting rotary encoder, enter key, etc. 770 represents another control section, which includes various other operators etc. than the above-mentioned.

Once predetermined operation is performed on the screen selection section 750, a "preference screen" to be used for customizing the mixing system is displayed on the display 720. On the preference screen, there are displayed three buttons for turning on/off the following three interlocked functions. ON/OFF state of these buttons can be switched by operation of the screen control section 760.

(1) Input-CUE Responding (Interlocking) Button: This button selects an ON/OFF state of an input-CUE responding (or interlocking) function for interlocking a SEL (i.e., selection) key 516 to operation of a CUE key 526 provided in the input channel strip section 500.

(2) Output-CUE Responding (Interlocking) Button: This button selects an ON/OFF state of an input-CUE responding (or interlocking) function for interlocking a SEL (i.e., selection) key 222 to operation of a CUE key 224 provided in the bus operator section 200.

(3) Bus-Selection Responding (Interlocking) Button: This button selects an ON/OFF state of a bus-selection responding (or interlocking) function for interlocking the CUE key 224 to operation of the MIX bus selection key 109.

In the instant embodiment, either one of the input-CUE interlocking button and output-CUE interlocking button and the bus selection interlocking button can not be set to the ON state simultaneously. Namely, the input-CUE interlocking button and output-CUE interlocking button mentioned at items (1) and (2) above can be turned on simultaneously, but are both automatically turned off as the bus-selection interlocking button mentioned at item (3) is turned on. As either one of the input-CUE interlocking button and output-CUE interlocking buttons is turned on, the bus-selection interlocking button is automatically turned off. On the above-mentioned preference screen, there are displayed, in addition to the input CUE, output CUE and bus-selection interlocking buttons, a plurality of buttons for controlling ON/OFF states of functions of interlocking screens to operation of various operators, displaying various checking dialogues and warning dialogues, etc.

Figure 5:
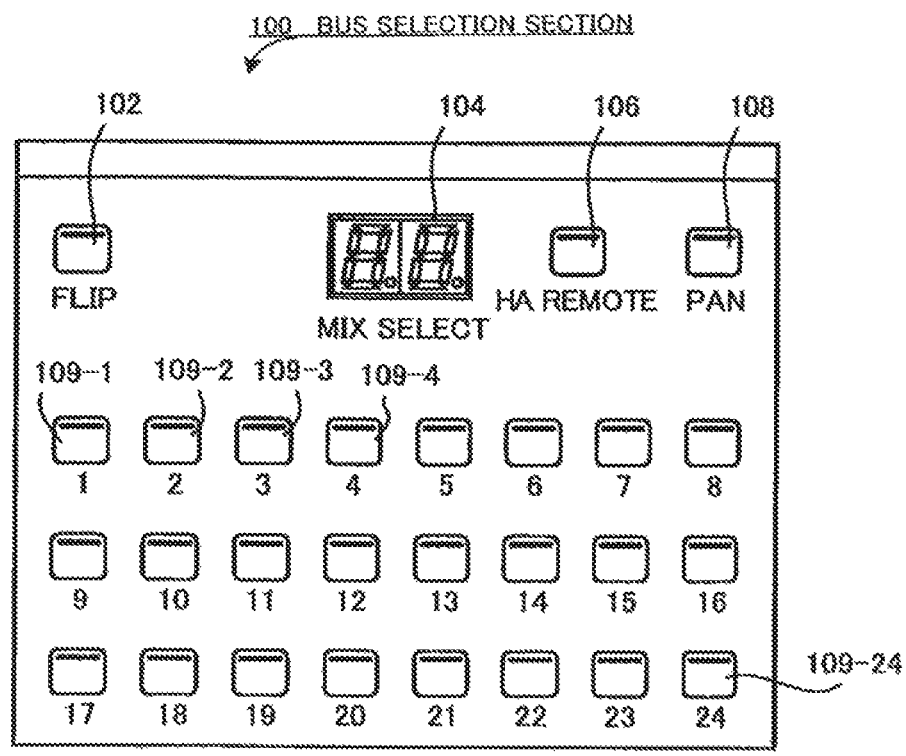
FIG. 5 is a top plan view showing an example of a bus selection section shown in FIG. 2.

3.1. Bus Selection Section 100:

The following paragraphs describe principal parts of the operation panel 2, starting with a detailed construction of the bus selection section 100 shown in FIG. 5.

In FIG. 5, reference numerals 109-1-109-24 represent MIX bus selection keys; 24 MIX bus selection keys are provided in corresponding relation to the 24 channels of the MIX buses 32-1-32-24. These MIX bus selection keys 109-1-109-24 are operable to select, in a toggle-like fashion, a MIX bus to be operated (hereinafter, "to-be-operated MIX bus") by a rotary encoder 514, ON key 512 etc. provided in the input channel strip section 500. In response to activation (turning-on operation) of one of the MIX bus selection keys 109-k corresponding to one of the MIX buses 32-k other than the to-be-operated MIX bus, the MIX bus selection key 109-k is illuminated, and the MIX bus 32-k is selected as a new to-be-operated MIX bus.

Thus, when a plurality of the MIX bus selection keys are sequentially turned on, only the MIX bus selection key 109-k corresponding to the last turned-on MIX bus selection key 109-k is selected as the to-be-operated MIX bus. Also, as the MIX bus selection key 109-k corresponding to the MIX bus 32-k already selected as the to-be-operated MIX bus is turned off, the MIX bus selection key 109-k is turned off, i.e. deilluminated, and the bus selection section 100 is brought to a non-bus-selecting state where no to-be-operated MIX bus is selected. The bus selection section 100 also includes an LED display 104, which displays a specific number (any one of "1"-"24") of the to-be-operated MIX bus or a character string "-" indicating the non-bus-selecting state.

As will be later detailed, for the input channel strip section 500, there can be set in a selected one of four operation modes, "normal mode", "FLIP mode", "HA_REMOTE mode" and "PAN mode". Details of the operation modes will be described later. The bus selection section 100 includes a FLIP key 102, HA_REMOTE key 106 and PAN key 108, which can be switched between ON and OFF states of the "FLIP mode", "HA_REMOTE mode" and "PAN mode" in a toggle-like fashion. The FLIP key 102, HA_REMOTE key 106 and PAN key 108 each have an LED built therein so that the LED of any one of the keys 102, 106, 108 is illuminated while the corresponding operation mode is selected or ON. In this instance, each of the "FLIP mode", "HA_REMOTE mode" and "PAN mode" can be turned ON exclusively; namely, once any one of the three operation modes is turned on by activation of the corresponding key 102, 106 or 108, the other operation modes are compulsorily turned off. When all of the three operation modes are in the OFF state, the input channel strip section 500 is set in the normal mode. Selection of the to-be-operated MIX bus by any one of the MIX bus selection keys 109-1-109-24 is also permitted in the "HA_REMOTE mode" or "PAN mode", and the result of the selection is reflected in the input channel strip section 500 only when the strip section 500 is in the normal mode or FLIP mode.

Figure 9:
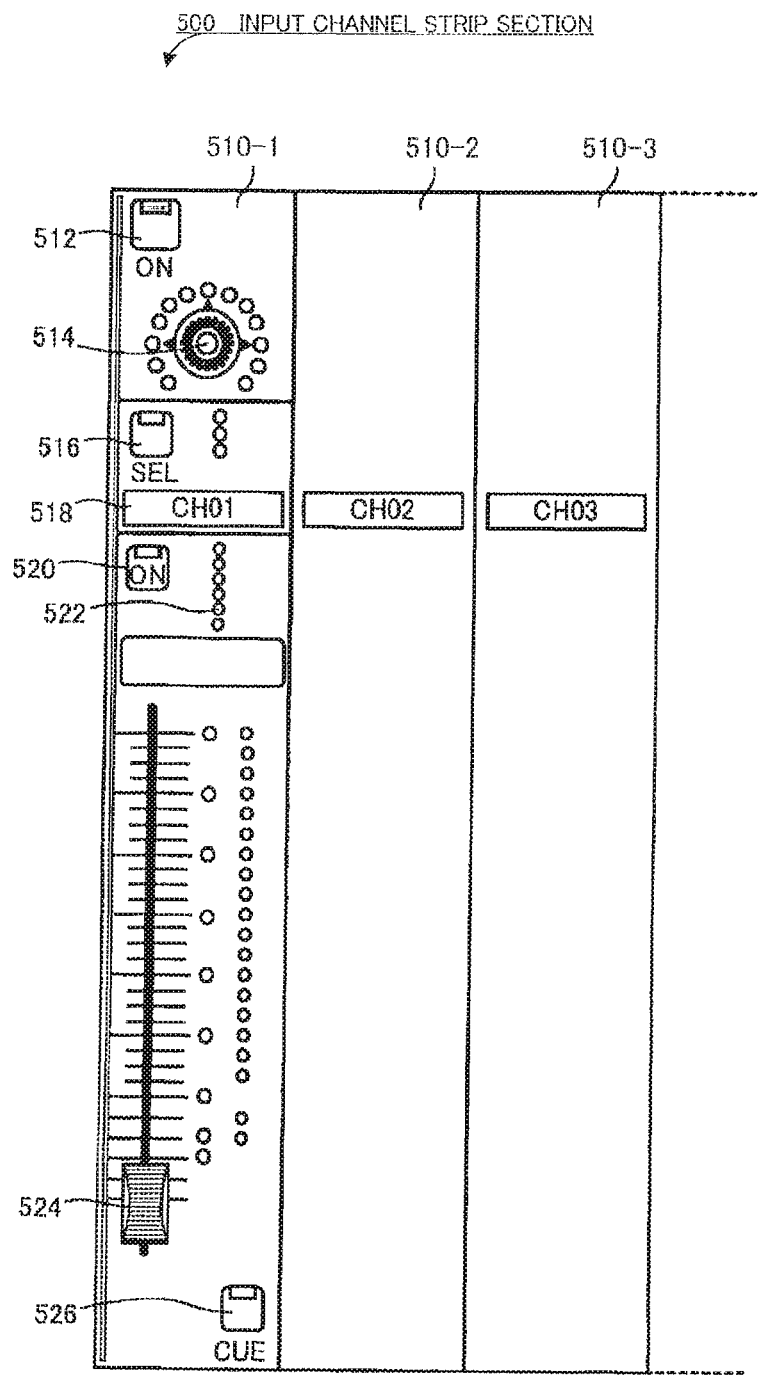
FIG. 9 is a top plan view showing an example of an input channel strip section shown in FIG. 2.

3.2. Input Channel Strip Section 500:

Detailed construction of the input channel strip section 500 will be described below with reference to FIG. 9. The input channel strip section 500 includes "24" channel strips 510-1-510-24. In the instant embodiment, there are provided "48" input channels as noted earlier, and these 48 input channels are divided into two layers, 24 channels per layer. When either one of the layers has been selected, the 24 input channels belonging to the selected layer are assigned to the channel strips 510-1-510-24 so that sound volumes etc. can be adjusted as desired. Hereinafter, the input channels thus assigned to the individual channel strips will be called "assigned input channels". The channel strips 510-1-510-24 are constructed in the same manner, and thus the following paragraphs representatively describe detailed construction of the channel strip 510-1.

In the channel strip 510-1, the rotary encoder 514 functions as follows on the basis of the operation mode selected. Specifically, in the operation mode, the rotary encoder 514 functions as an operator for setting a send level to the to-be-operated MIX bus (i.e., gain of the send level adjustment sections 64-1-64-24 of FIG. 4). In the PAN mode, the rotary encoder 514 functions as an operator for adjusting panning balance between the channels. In the HA_REMOTE mode, the rotary encoder 514 functions as an operator for remote-controlling equipment connected to the other I/O section 8. Further, in the FLIP mode, the rotary encoder 514 functions as an operator for adjusting a level of the assigned input channels (i.e., gain of the sound volume adjustment section 56).

Further, in the channel strip 510-1, the ON key 512 functions as follows on the basis of the operation mode selected. Specifically, in the operation mode, the ON key 512 functions as a key for switching between the ON and OFF states of signal delivery ("send") to the to-be-operated MIX bus (i.e., states of the MIX-bus signal switching sections 62-1-62-24 of FIG. 4). In the FLIP mode, the ON key 512 functions as a key for switching between the ON and OFF states of the assigned input channel (i.e., state of the ON/OFF switching section 54 of FIG. 4). In the PAN mode, the ON key 512 does not function. In the HA_REMOTE mode, the ON key 512 functions as a key for remote-controlling an ON/OFF state of a predetermined function of the equipment connected to the other I/O section 8. The ON key 512 has an LED built therein, which is, in each of the operation modes, illuminated when the corresponding function is turned on but deilluminated when the corresponding function is turned off.

The SEL key 516 is a key for instructing that a channel to be operated in the selected channel control section 300, bus operator section 200 (mix send mode), etc. (hereinafter called a "selected channel") be set as the assigned input channel. Although the SEL key 516 is provided in each of the channel strips 510-1-510-24, the SEL key 516 in only one of the channel strips 510-1-510-24 can be selectively turned on. Thus, once the SEL key 516 is depressed to be set to the ON state in any one of the channel strips 510-1-510-24, the SEL keys 516 in the other channel strips are compulsorily turned off.

Further, in the input channel strip section 500, a display 518 displays a name (four letters at the maximum) of the assigned input channel, and the ON key 520 functions as follows on the basis of the operation mode selected. Specifically, in the FLIP mode, the ON key 520 functions as a key for switching between the ON and OFF states of "send" to the to-be-operated MIX bus (i.e., state of the MIX-bus signal switching sections 62-1-62-24 of FIG. 4). In each of the other modes than the FLIP mode, the ON key 520 functions as a key for switching between the ON and OFF states of the assigned input channel (i.e., state of the ON/OFF switching section 54 of FIG. 4). The ON key 520 too has an LED built therein, which is illuminated when the corresponding function is turned on but deilluminated when the corresponding function is turned off.

The input channel strip section 500 also includes an electric fader 524, which functions as follows on the basis of the operation mode selected. Specifically, in the FLIP mode, the electric fader 524 functions as an operator for setting a send level to the to-be-operated MIX bus. In the other modes, the electric fader 524 functions as an operator for adjusting the level of the corresponding assigned input channel (i.e., gain of the sound volume adjustment section 56 of FIG. 4). The CUE key 526 switches between CUE ON and CUE OFF states of the assigned input channel. Once the CUE (i.e., selection of a monitoring channel) is turned on, the sound signal of the assigned input channel is supplied to the CUE bus 34.

The CUE key 526 and other CUE keys (to be described later) can operate in two modes, "MIX_CUE mode" and "LAST_CUE mode". The MIX_CUE mode is an operation mode in which a plurality of CUE keys can be turned on and sound signals corresponding to the turned-on CUE keys are mixed via the CUE bus 34 and the mixed results are output as CUE signals. The LAST_CUE mode is an operation mode in which only a sound signal corresponding to the last-turned-on CUE key is supplied to the CUE bus 34 and sound signals corresponding to the other CUE keys are automatically set in the OFF state. Operator for selecting one of the MIX_CUE mode and LAST_CUE mode is provided in the above-mentioned other control section 770.

When the input-CUE interlocking function is in the ON state and once the CUE key 526 of any one of the channel strips 510-1-510-24 is turned on in the LAST_CUE mode, the corresponding SEL key 516 is also turned on in response to (i.e., in an interlocked relation to) the turned-on CUE key 526. One of important features of the instant embodiment resides in this arrangement. Namely, once the CUE key 526 of any one of the channel strips 510-1-510-24 is operated to turn on while the LAST_CUE mode is selected, a current state of the assigned input channel corresponding to the one channel strip is automatically reflected in the selected channel control section 300. However, even when the SEL key 516 of any one of the channel strips 510-1-510-24 has been operated, the instant embodiment prevents the ON/OFF state of the CUE key 526 belonging to the same channel strip from being interlocked to the operation of the SEL key 516.

Primary reason why the instant embodiment employs such an arrangement is as follows.

The human operator turns on the CUE key 526 of any one of the channel strips 510-1-510-24 in the LAST_CUE mode when the human operator wants to selectively monitor only the sound signal of the corresponding assigned input channel. It has been empirically ascertained that the human operator in most cases wants to selectively monitor only the sound signal of a particular input channel when he or she wants to adjust the sound volume of the input channel, i.e. when he or she wants to set the input channel as a "selected channel" in the selected channel control section 300.

Thus, the instant embodiment is constructed so that, if, in such a case, the human operator only activates the CUE key 526, it simultaneously changes a to-be-monitored channel selected via the CUE bus 34 to another and a to-be-operated channel to another in each of the selected channel control section 300 and bus operator section 200 (mix send mode), thereby reducing the operating labor of the human operator. Further, the reason why the CUE key 52 is prevented from being interlocked to the operation of the SEL key 516 is that there are many cases where the to-be-monitored channel selected via the CUE bus 34 should not be changed even when the human operator has changed the to-be-operated channel to another in the selected channel control section 300. One example of such cases is where the human operator wants to have a given input channel adjusted by the selected channel control section 300 while monitoring the overall sound quality and volume.

Figure 10:
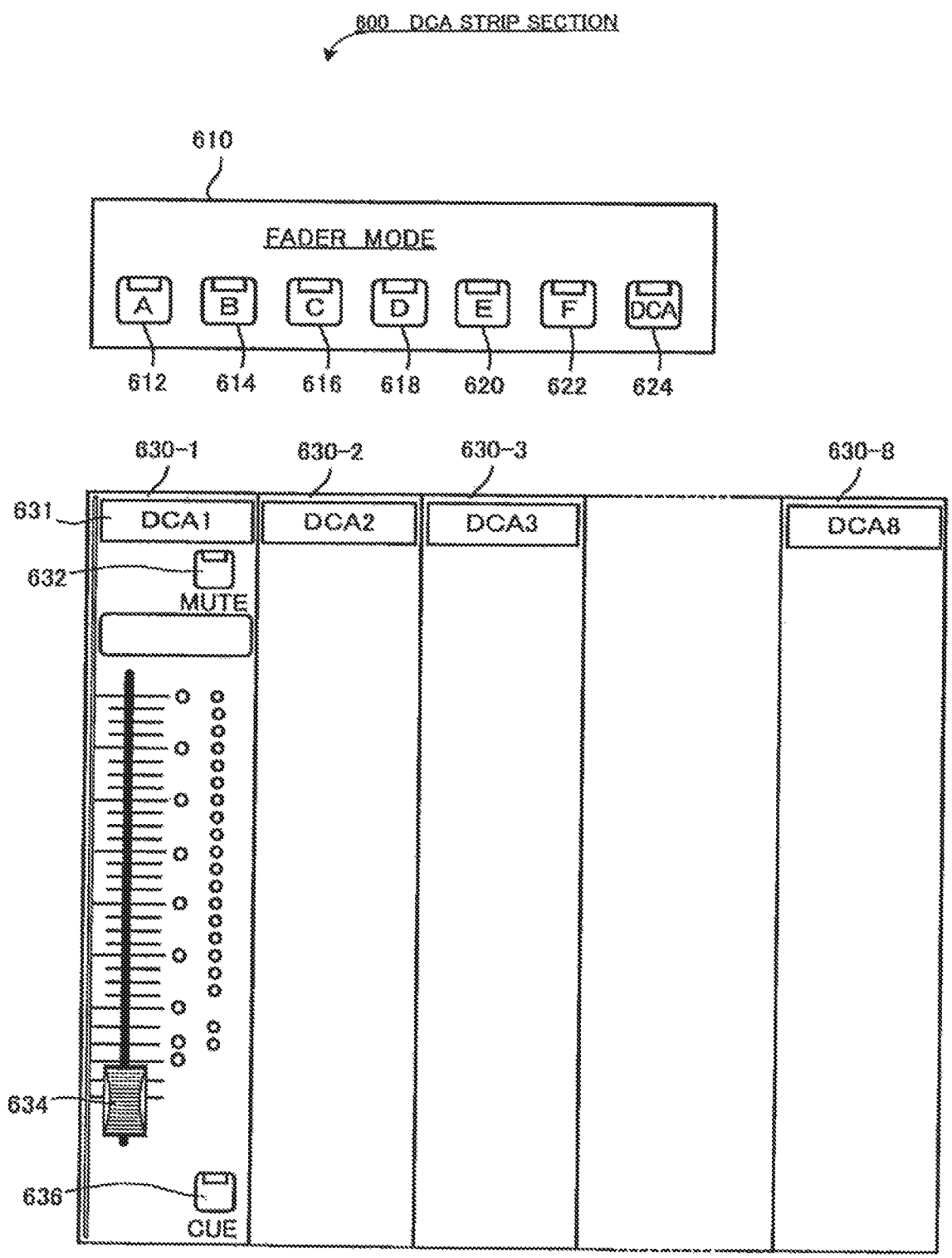
FIG. 10 is a top plan view showing an example of an assigned channel strip section shown in FIG. 2.

3.3. Assigned Channel Strip Section 600:

Next, a detailed construction of the assigned channel strip section 600 will be described with reference to FIG. 10.

The assigned channel strip section 600 includes "8" (eight) channel strips 630-1-630-8 which are constructed generally in the same manner. Various functions can be assigned to these channel strips 630-1-630-8. Mode in which different functions are assigned to these channel strips 630-1-630-8 on a one-to-one basis is referred to as a "one fader mode", and functions corresponding to a total of seven different "fader modes" can be assigned to the channel strips. Reference number 610 represents a fader mode selection section, which allows the human operator to select any one of the fader modes via keys 612-622 provided therein; any one of the keys can be activated or turned on by the human operator.

Examples of the functions (operation modes) assigned to the individual channel strips include sound volume adjustment of the input channel (input channel mode), sound volume adjustment of the MIX output channel (MIX output channel mode), gain adjustment of the internal effecter 26 (see FIG. 2) (effecter mode), DCA (Digital Controlled Amplifier or Digital Controlled Attenuator) level adjustment (DCA mode), etc. The sound volume adjustment of the input channel can be performed in the above-mentioned input channel strip section 500; however, such sound volume adjustment can also be performed on the input channels belonging to the layer not currently selected, if the input channels are assigned to the channel strips 630-1-630-8.

In the instant embodiment, the bus operator section 200 includes rotary encoders (as will be later detailed), and the sound volume adjustment of the individual MIX output channels can be carried out by such rotary encoders. In addition, by allocating any of the MIX output channels etc., having particularly high frequency of use, to any of the channel strips, the instant embodiment can enhance the operability of the corresponding MIX output channel.

The DCA (Digital Controlled Amplifier or Digital Controlled Attenuator) scheme employed in the instant embodiment is explained below. The DCA scheme is a technique where a same or common fader (DCA fader), separate from the faders of the input channels, is allocated to a plurality of input channels and where gains set by the faders of the individual input channels are multiplied by a gain set by the DCA fader so as to determine respective gains of the plurality of input channels. The DCA mode is used primarily in sound volume control of a large-size musical instrument, such as a piano or drum, or a part of an orchestra.

In general, musical sounds performed by a piano or other large-size musical instrument are picked up by a plurality of microphones. These microphones are allocated to different input channels for balance adjustment, and these input channels are allocated to a single DCA fader. Balance among the sound signals picked up by the individual microphones is adjusted via the faders of the input channels, and the overall sound volume of the musical instrument is adjusted by the DCA fader.

Thus, if the function of any one of the channel strips 630-1-630-8 is assigned to the DCA, the level of an input channel belonging to a DCA group, i.e. level to be set in the sound adjustment section 56 (see FIG. 4), is set to a result of multiplication between an operated amount of a fader specific to the input channel and an operated amount of a DCA fader.

In the channel strip 630-1, a display 631 displays display a name (four letters at the maximum) of an input channel assigned to the channel strip 630-1. Reference numeral 632 represents a DCA_MUTE key, which functions only when the operation mode is a DCA mode. Namely, once a DCA_MUTE key 632 is turned on in the DCA mode, the levels of the input and output channels belonging to the DCA group (gain of the sound adjustment section 56) are all set to "0".

The channel strip 630-1 includes an electric fader 634, which adjusts a DCA level, levels of the input and output channels, or the like depending on the function assigned to the channel strip. In the other operation modes than the DCA mode, a CUE key 636 functions as a key for performing ON/OFF control on supply, to the CUE bus 34, of output signals of the corresponding input and output channels or effecter. In the DCA mode, the CUE key 636 functions as a key for simultaneously performing ON/OFF control of the CUE ON/OFF switching sections 60 (see FIG. 4) of all the input channels belonging to the DCA group. Note that the other channel strips 630-2-630-8 provided in the assigned channel strip section 600 are constructed similarly to the channel strip 630-1.

3.4. Selected Channel Control Section 300:

Next, details of the selected channel control section 300 will be described with reference to FIGS. 7 and 8. As illustrated in FIG. 7, the selected channel control section 300 includes an attenuator section, which performs attenuation, phase switching, insertion effect impartment, etc. in the sound quality adjustment section 52 or 72 of the selected channel. Noise gate section 320 makes noise gate settings in the sound quality adjustment section 52 or 72, and a level meter section 340 displays a sound signal level of the selected channel.

The selected channel control section 300 also includes a channel selection section 350 which designates a selected channel; note that the selected channel can also be designated by the SEL key 516 of the input channel strip section 500, etc. Display 352 displays a channel number of the selected channel. INC (i.e., increment) key 354 increments the channel number of the selected channel by one, and a DEC (i.e., decrement) key 356 decrements the channel number of the selected channel by one.

Reference numeral 364 represents a COPY key for copying settings of the selected channel control section 300 to a copy buffer (predetermined area of the RAM 14). PASTE key 368 is operable to reflect settings stored in the copy buffer in the selected channel control section 300 as settings of the selected channel. Group setting section 370 performs an operation for including the selected channel in the DCA group or the like, or excluding the selected channel from the DCA group or the like. Delay section 380 sets delay characteristics of a sound signal.

Figure 8:
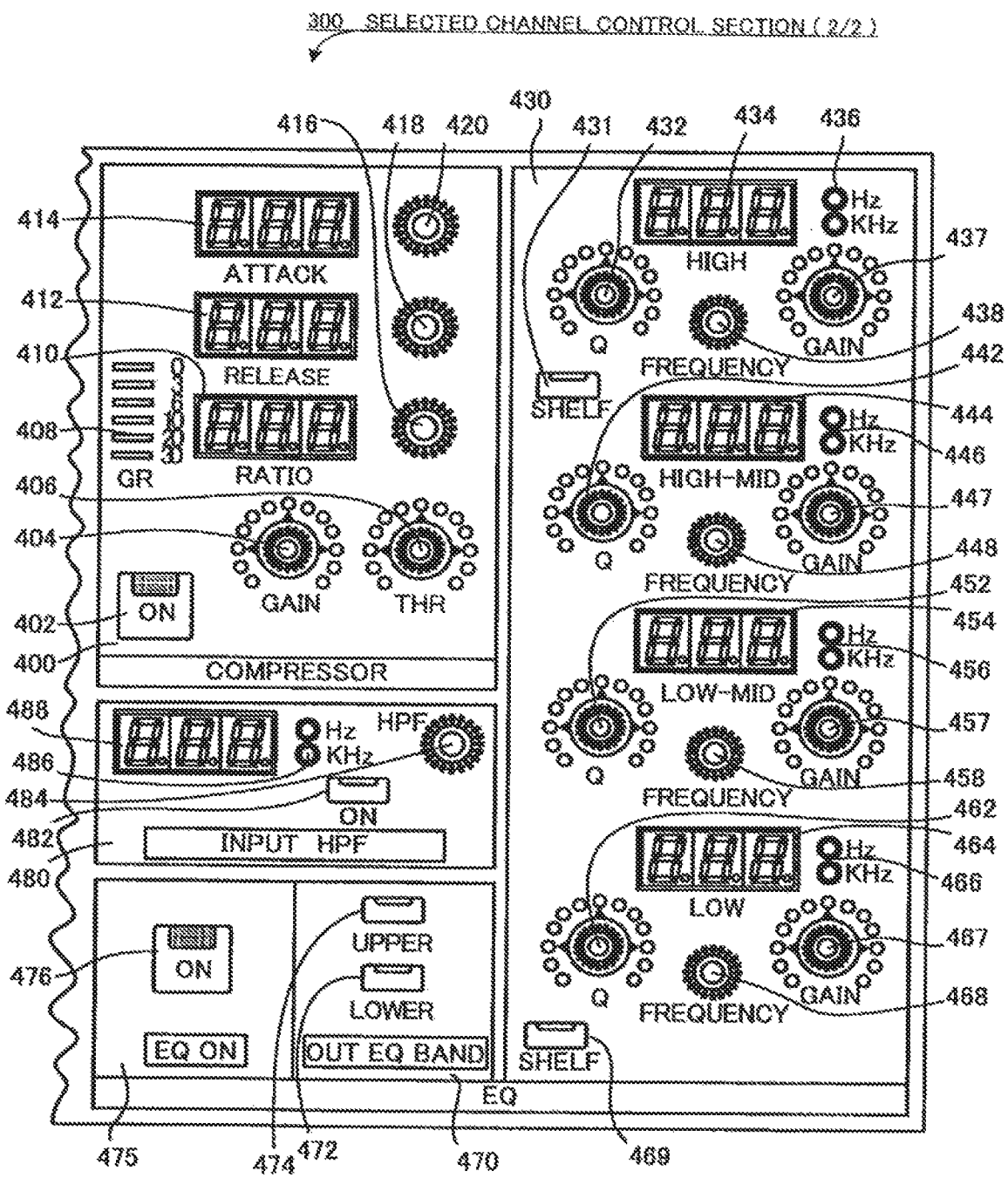
FIG. 8 is a top plan view showing an example construction of the other half portion of the selected channel control section shown in FIG. 2.

Further, as shown in FIG. 8, the selected channel control section 300 also includes a compressor section 400, which sets an internal compressor in the sound quality adjustment section 52 or 72 of the selected channel. Reference numeral 430 represents an equalizer section, which sets frequency characteristics of four bands, i.e. high frequency band (HIGH), high medium frequency band (HIGH MID), low medium frequency band (LOW MID) and low frequency band (LOW), in an equalizer of the sound quality adjustment section 52 or 72. Rotary encoder 438 sets a center frequency of the high frequency band (HIGH), and the center frequency set by the rotary encoder 438 is displayed on a display 434. Rotary encoders 437 and 432 adjust a gain and Q value, respectively, at the center frequency of the high frequency band (HIGH). Operated amounts of the rotary encoders 437 and 432 are indicated by LEDs arranged circularly around the rotary encoders 437 and 432. Similar operators and displays are also provided in relation to the high medium frequency band (HIGH MID), low medium frequency band (LOW MID) and low frequency band (LOW). High-pass filter setting section 480 makes settings for a high-pass filter to be applied to a sound signal.

Figure 6:
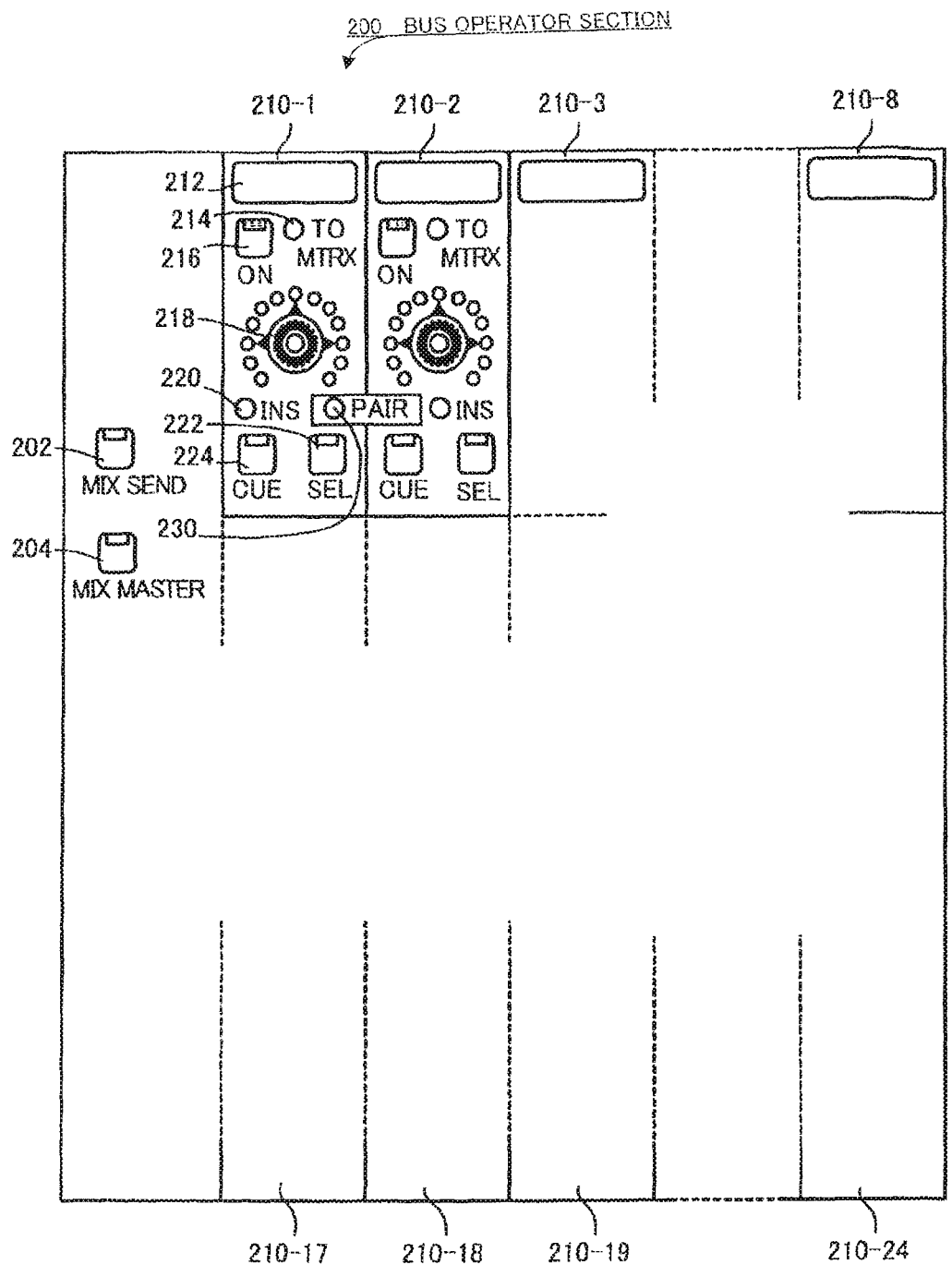
FIG. 6 is a top plan view showing an example of a bus operator section shown in FIG. 2.

3.5. Bus Operator Section 200:

Next, a detailed construction of the bus operator section 200 with reference to FIG. 6. In the bus operator section 200, either one of a "mix send mode" and "mix master mode" can be selected. The mix send mode is an operation mode for, when any of the input channels is a selected channel, controlling send levels, i.e. levels of signals to be supplied from the input channel to a plurality of the MIX buses. For example, if the first input channel has been selected by the SEL key 516 of the input channel strip section 500, then signal levels of a plurality of the send level adjustment sections 64-1-64-24 (see FIG. 4) etc. in the corresponding input channel adjustment section 30-1 are adjusted in the bus operator section 200. The mix master mode is an operation mode for adjusting levels of the sound volume adjustment sections 76 etc. in the MIX output channel sections 36-1-36-24. Note that, when any of the output channels is a selected channel, only the mix master mode is selectable, i.e. the mix send mode is non-selectable. If the selected channel has been switched to any one of the MIX output channels while the mix send mode is selected, the bus operator section 200 is brought to an operation mode where neither of the mix send mode and mix master mode is selected, so that any operation on the bus operator section 200 is invalidated.

The bus operator section 200 also includes a mix send key 202 and mix master key 204, each of which shifts the operation mode to either the mix send mode or the mix master mode each time it is depressed. Each of the mix send key 202 and mix master key 204 has a built-in LED that is illuminated while the corresponding operation mode is being selected. Reference numerals 210-1-210-24 represent bus control sections, which correspond to the MIX buses 32-1-32-24 in each of the operation modes. The bus control section 210-1 includes an ON key 216, rotary encoder 218, CUE key 224 and SEL (i.e., selection) key 222. Note that the other bus control sections 210-2-210-24 also include similar operators. Functions of these operators will be detailed in relation to the different operation modes.

3.5.1. Mix Send Mode:

First, in the mix send mode, the bus control section 210-n (n is an arbitrary number in the range of 1-24) is associated with the MIX bus 32-n, and the bus control sections 210-n functions as a group of operators for performing control related to signal supply from a selected channel (in this case, m-th input channel) to the MIX bus 32-n. In the instant mix send mode, the ON key 216 functions as a key for switching, in a toggle-like manner, between ON and OFF states of the signal supply from the m-th input channel to the MIX bus 32-n, i.e. ON and OFF states of the signal switching section 62-n of the input channel adjustment section 30-m.

Further, in the mix send mode, the rotary encoder 218 functions as an operator for adjusting the level of the send level adjustment section 64-n in the input channel adjustment section 30-m. In this mode, the CUE 224 does not function and is constantly kept in a deilluminated (non-illuminated) state. Further, the SEL key 222 functions in the same manner as the MIX bus selection keys 109-1-109-24 provided in the bus selection section 100, i.e. the SEL key 222 functions as a key for selecting a to-be-operated MIX bus in an interlocked relation to the corresponding MIX bus selection key 109-n. However, the SEL key 222 is constantly kept in a deilluminated state, and the selected to-be-operated MIX bus is displayed only in the corresponding MIX bus selection key 109-n.

3.5.2. Mix Master Mode:

In the mix master mode, the bus control section 210-k (k is an arbitrary number in the range of 1-24) is associated with the MIX output bus 36-k, and the bus control section 210-k functions as a group of operators for performing control in the MIX output bus 36-k. In the instant mix master mode, the ON key 216 functions as a key for switching, in a toggle-like manner, between ON and OFF states of the entire MIX output bus 36-k, i.e. state of the ON/OFF switching section 74. The rotary encoder 218 functions as an operator for adjusting levels of the sound volume adjustment sections 76 in the MIX output channel sections 30-k.

Further, in the instant operation mode, the CUE key 224 functions as a key for switching, in a toggle-like manner, between ON and OFF states of the CUE ON/OFF switching section 80, i.e. determining whether or not the sound signal of the MIX output channel section 36-k should be to the CUE bus 34. The SE, key 222 functions as a key for setting the MIX output channel section 36-k as a selected channel (i.e., channel that will be operated in the selected channel control section 300 etc.). As set forth above, when any one of the MIX output channels is a selected channel, the operation mode of the bus operator section 200 can not be set to the mix send mode.

Here, the operation mode of the CUE key 224 is selected between the LAST_CUE mode and the MIX_CUE mode. One of the important features of the instant embodiment resides in behavior in the LAST_CUE mode. Namely, once the CUE key 224 is turned on in any of the bus control sections 210-k while the output-CUE interlocking function and the LAST_CUE mode are ON, the SEL key 222 belonging to the bus control section 210-k is also turned on in response to the turned-on CUE key 224. However, even when any one of the SEL keys 222 been operated, the instant embodiment prevents the ON/OFF state of the CUE key 224 belonging to the same bus control section from being interlocked to the ON/OFF state of the CUE key 224.

Primary reason why the instant embodiment employs such an arrangement is similar to the reason stated above in relation to the operation of the SEL key 516 and CUE 526 in the input channel strip section 500. Namely, in most cases, the human operator turns on the CUE key 224 in any one of the bus control sections 210-k when he or she wants to adjusts the sound quality of the corresponding MIX output channel.

Thus, the instant embodiment is constructed so that, if, in such a case, the human operator only activates the CUE key 224, it simultaneously change a to-be-monitored channel selected via the CUE bus 34 and a to-be-operated channel in the selected channel control section 300 in generally the same manner as set forth above in relation to the input channel strip section 500, thereby reducing the operating labor of the human operator. Further, because the human operator may also sometimes want to adjust a given MIX output channel in the selected channel control section 300 while monitoring the overall sound quality and volume, the instant embodiment prevents the CUE key 224 from being interlocked to the operation of the SEL key 222.

Another one of the important features of the instant embodiment resides in the following interlocking functions of the CUE 224 that operates irrespective of whether the LAST_CUE mode or the MIX_CUE mode is ON.

Interlocking Function 1: As any one of the MIX bus selection keys 109-$k$ is turned on while the bus-selection interlocking function is ON, the CUE ON/OFF switching section 80 of the MIX output channel section 36-$k$ corresponding to the MIX bus 32-$k$ is turned on (i.e., interlocking CUE function, namely, CUE state set by the interlocking CUE selection function, is turned on). If the bus operator section 200 is in the mix master mode at that time, the CUE key 224 belonging to the corresponding bus control section 210 is illuminated. As a modification of Interlocking Function 1, when any one of the MIX bus selection keys 109-$k$ has been activated twice or a predetermined plurality of times in succession, the interlocking CUE function may be set to the ON state. Because the interlocking CUE function is set to the ON state only when the MIX bus selection key 109-$k$ has been intentionally activated twice or a predetermined plurality of times in succession, it is possible to minimize operational errors.

Interlocking Function 2: If the existing CUE function (i.e., CUE state set by the existing CUE selection function) of any one of the input channels or MIX output channels is already ON when the MIX bus selection key 109-$k$ has been turned on, the existing CUE function is temporarily canceled; instead, the interlocking CUE function of the MIX output channel section 36-$k$ is turned on. Further, once another MIX bus selection key 109-$j$ is turned on under such condition, the last interlocking CUE function is canceled; instead, the interlocking CUE function of the MIX bus output channel section 36-$j$ is turned on.

Interlocking Function 3: Once the MIX bus selection key 109-$k$ of the to-be-operated MIX bus is turned off while the interlocking CUE function is ON, the current interlocking CUE function is canceled. If the existing CUE function has been temporarily canceled at the time of initiation of the interlocking CUE function, the temporarily-canceled existing CUE function is restored.

Interlocking Function 4: When any one of the CUE keys 526 and 224 of the input channels and MIX output channels has been turned on while the interlocking CUE function is ON, the interlocking CUE function is canceled and only the CUE function corresponding to the turned-on CUE key is turned on.

The following paragraphs explain reasons why the above interlocking functions are employed.

As Regards Interlocking Function 1:

When monitoring signals to be returned to performers in a concert or radio or TV program, human operators in the conventional mixing systems had to operate a MIX bus selection key (109-$k$) to select, as a to-be-operated MIX bus, a MIX bus (32-$k$) mixing the monitoring signals and then operate a CUE key (224) in a bus control section (210-$k$) corresponding to the to-be-operated MIX bus. The mixing system constructed according to the instant embodiment of the prevent invention, however, can simultaneously designate the to-be-operated MIX bus and set the interlocking CUE function, by just turning on the bus-selection interlocking function.

As Regards Interlocking Function 2:

Even if designation of a CUE signal has already been made in the LAST_CUE mode or MIX_CUE mode when Interlocking Function 1 is to be performed, Interlocking Function 2 can cancel the existing CUE function in response to turning-on of the MIX bus selection key 109-$k$ and thereby set an independent interlocking CUE key for the to-be-operated MIX bus.

As Regards Interlocking Function 3:

When the MIX bus selection key 109-$k$ has been turned off, the interlocking CUE function is canceled, and the CUE state immediately before execution of the interlocking CUE function is restored. Thus, even when a request for adjusting the monitoring signals is received as an interrupt while the human operator is doing ordinary work, Interlocking Function 3 can promptly resume the work after completion of the monitoring signal adjustment. Because such a monitoring signal adjustment request is temporary and occurs on an irregular basis, this function can promptly switch between the monitoring signal adjustment and the ordinary work, thereby greatly reducing the labor of the human operator.

As Regards Interlocking Function 4:

By the human operator operating the CUE key 526 or 224 of any one of the input channels or MIX output channels, Interlocking Function 4 can set a new CUE state. Further, because each of the CUE keys 526 and 224 operates in a toggle-like manner, the interlocking function can cancel the new CUE state to set a state where all the CUE functions are canceled, in response to human operator's successive operation of the same CUE key.

3.5.3. Relationship Between Bus Operator Section 200 and Other Sections:

In the bus operator section 200, the bus control sections 210-1-210-24 are arranged in eight vertical rows and three horizontal rows. Namely, the bus control sections 210-1-210-8 are sequentially arranged in the first (i.e., uppermost horizontal) row, the bus control sections 210-9-210-16 are sequentially arranged in the second horizontal row, and the bus control sections 210-17-210-24 are sequentially arranged in the third (lowermost horizontal) row. With such an arrangement, the human operator can identify, with utmost ease, the bus control section 210-1-210-24 corresponding to any one of the input channels or MIX buses to be adjusted.

The above-described embodiment is also characterized in that the bus selection section 100, bus operator sections 200, selected channel control section 300 and display 720 are sequentially arranged in a left-to-right direction in parallel to the input channel strip section 500. When settings for the limiter process etc. are made in the selected channel control section 300, a graph showing characteristics being set is displayed on the display 720 located adjacent to the selected channel control section 300. Thus, the human operator can set characteristics while readily viewing relationship between respective operating positions of the various operators in the selected channel control section 300 and the graph of the characteristics being set. Because settings to be made in the bus operator sections 200 concern gains etc., there is little need to visually compare contents of a given graph and operational contents of the bus operator sections 200. Therefore, no significant inconvenience will occur even where the bus operator sections 200 and the display 720 are separated from each other by a relatively great distance.

In the conventional mixing systems, such as the one disclosed in the non-patent document, "CSID Control Surface Instruction Manual", published by Yamaha Corporation, December, 2000, where the selected channel control section (300) includes a group of operators not related to displayed information on the display (720), i.e. group of operators for setting send levels to a plurality of MIX buses, the selected channel control section (300) tends to be very hard to use and manipulate due to a great number of the operators provided therein. Further, according to the technique disclosed in the non-patent document, there are provided separate selected channel control sections for input channels and for MIX output channels, which results in a further increased number of the operators.

By contrast, in the above-described embodiment of the present invention, the operator group, which used to be included in the selected channel control section (300) in the conventional mixing systems, is provided as the bus operator sections 200 independently of the selected channel control section 300, and such bus operator sections 200 are located adjacent to the selected channel control section 300 remotely from the display 720. Thus, the human operator can readily recognize the positions of the operators, and distances over which his or her observing points should move can be reduced effectively.

Further, in the above-described embodiment, the operation mode switching feature allows the bus operator sections 200 to be shared between "control of signals to be sent from a single selected channel to a plurality of MIX buses" and "control of signals to be sent from a plurality of MIX output channels corresponding to the MIX buses". Thus, in the instant embodiment, the number of the operators can be reduced to a considerable degree, which can even further enhance the operability. In addition, the above-mentioned two types of signal control each correspond to the MIX buses 32-1-32-24, and the bus control section 210-$k$ corresponding to a given MIX bus 32-$k$ is constant irrespective of the operation mode selected. Therefore, according to the instant embodiment, there can be achieved the particular benefit that the correspondency between the MIX buses and the operators is clear and easy to recognize, even though a plurality of functions corresponding to various operational modes are assigned to the same operators.

Further, in the above-described embodiment, the operators of the bus operator section 200, corresponding to the MIX buses, are arranged in eight vertical rows and three horizontal rows. Such an arrangement of the bus operators is just the same as an arrangement of the MIX bus selection keys 109-1-109-24 of the bus selection section 100 which are provided for switching the functions of the rotary encoder 514 etc. of the input channel strip section 500. Therefore, when the human operator operates the bus selection section 100 after operating the bus operator section 200 or operates the bus operator section 200 after operating the bus selection section 100, he or she can readily visually recognize the correspondency between the individual operators and the MIX buses. Further, when the operation mode of the bus operator section 200 is the mix send mode, the SEL key 222 in the bus operator section 200 can perform the same functions as the MIX bus selection keys 109-1-109-24 in the bus selection section 100. Thus, for example, when the adjustment of send levels from a single selected channel of the bus operator section 200 to a plurality of the MIX buses and the adjustment of send levels to a single MIX bus by the rotary encoder 514 of the input channel strip section 500 are to be carried out in an alternate fashion, the instant embodiment can achieve enhanced operability.

4. Behavior of the Embodiment:

4.1. General Behavior:

The following paragraphs describe general behavior of the embodiment of the mixing system.

First, when an operation event of any one of the operators, such as the electric faders, rotary encoders and keys, has occurred in the mixing system, a routine corresponding to the meaning of the operation event is started up. Specifically, when there has occurred an operation event concerning ordinary sound volume/quality adjustment other than special operation events concerning reproduction of a scene etc., an operation event routine of FIG. 11 is started up.

Figure 11:
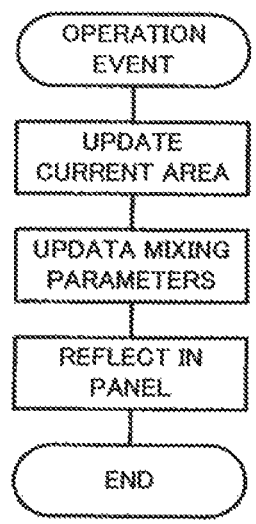
FIG. 11 is a flow chart showing an example of a control program executed by a CPU of FIG. 1.

At step SP2 of the operation event routine of FIG. 11, the stored contents in the current areas including the current scene area 14$a$ are updated on the basis of the meaning of the operation event. For example, when any one of the electric faders or rotary encoders, control data (e.g., level data, frequency data etc.) corresponding an operated amount are stored into corresponding locations of the current area. When any one of the keys has been operated, the current ON/OFF state etc. of the operated key is stored. At next step SP4, various parameters in the mixing algorithm (see FIGS. 3 and 4), i.e. stored contents of various parameter registers provided in the signal processing section 6, are updated on the basis of current stored contents of the current area.

At next step SP6, various settings on the operation panel 2 are executed on the basis of the updated contents of the current area. For example, illumination/deillumination of the LED within the key, illumination/deillumination of the LEDs around the rotary encoder, changes in the displayed contents of the various displays, driving of the electric fader, and/or the like is executed. Processes related to the three interlocking functions, i.e. input-CUE interlocking function, output-CUE interlocking function and bus-selection interlocking function, in the embodiment of the mixing system are all carried out at step SP2. Namely, at step SP2, the control data currently stored in the current area in association with the operated operator are updated on the basis of the operational meaning of the operated operator, and a determination is made as to whether or not the responding or interlocking function pertaining to the operated operator is now in the ON state or not. If the interlocking function pertaining to the operated operator is now in the ON state, control data of one or more other operators that should be interlocked in accordance with the interlocking function are also updated.

4.2. Specific Behavior:

The following paragraphs specifically describe a typical example of behavior of the instant embodiment.

Let it be assumed that the second MIX output channel is assigned to signal motoring of a given performer on a stage, and that there has been made a request regarding the monitoring signal that "the overall sound volume be raised with a percussion sound lowered in volume". The human operator performs the following operation in order to meet the request.

First, once the human operator depresses the mix master key 204 in the bus operator section 200, the operation mode of the bus operator section 200 is set to the mix master mode, and current settings of the MIX output channel 36-$k$ are reflected in each of the bus control section 210-$k$. Namely, illumination states of the LEDs around the rotary encoder 218 in each of the bus control sections 210-$k$ is set in accordance with a gain set in the sound volume adjustment section 76 (FIG. 4) of each of the MIX output channel sections 36-$k$.

Then, when the human operator has turned on the MIX bus selection key 109-2 in the bus selection section 100, the second MIX output channel corresponding to the MIX bus selection key 109-2 is selected as a to-be-operated MIX bus. If the bus-selection interlocking function is ON at that time, the CUE ON/OFF switching section 80 in the MIX output channel section 36-2 is automatically set to the ON state as an interlocking CUE. Namely, the monitoring signal of the second MIX output channel is audibly reproduced through headphones or monitoring speaker.

If the operation mode of the bus operator section 200 is currently set in the mix master mode, the CUE key 224 of the bus control section 210-2 is also automatically set to an illuminated state. The CUE state immediately before the interlocking CUE was set is stored temporarily stored in a predetermined region of the RAM 14. Thus, because the second MIX output channel has been selected as the to-be-operated MIX bus, the current send level from each of the input channels to the second MIX output channel is reflected in the rotary encoder 514 included in each of the channel strips 510-1-510-2, if the operation mode of the input channel strip section 500 is the normal mode.

Thus, the human operator can adjust the sound volume of the second MIX output channel by operating the rotary encoder 218 of the bus control section 210-2 corresponding to the second MIX output channel. Also, by operating the rotary encoder 514 of any of the input channels which pertains to a "percussion", the human operator can lower the send level of the "percussion". Because the CUE ON/OFF switching section 80 in the MIX output channel section 36-2 has been automatically set in the ON state, the human operator can perform these operation while actually listening to monitoring sounds of the second MIX output channel.

Once the human operator again depresses the MIX bus selection key 109-2 (i.e., turns off the MIX bus selection key 109-2) after completion of the setting of the second MIX output channel, the CUE state immediately before the setting of the interlocking CUE state is read out from the predetermined region of the RAM 14 and reproduced on the operation panel 2. In this way, the human operator can promptly proceed with the adjustment etc. that were being performed previously.

5. Modifications:

The present invention is not limited to the above-described embodiment and may be modified variously as set forth below by way of example.

(1) The above-described embodiment of the mixing system is constructed to be controlled in accordance with programs executed by the CPU 10. Only such programs may be stored in a recording medium, such as a CD-ROM or flexible disk, and distributed in the recording medium, or distributed through a communication path.

(2) Further, in the above-described embodiment, the bus control sections 210-1-210-24 are arranged in eight vertical rows and three horizontal rows. However, the bus control sections 210-1-210-24 may be arranged in any other suitable manner. For example, the bus control sections may be arranged in "P" horizontal rows and "Q" vertical rows (i.e., P×Q bus control sections), where "P" and "Q" are each an arbitrary natural number greater than one. Further, if "P" and "Q" are each set to an arbitrary natural number greater than two, the overall configuration of the arranged bus control sections can be closer to a square, which is even more preferable. Similarly, whereas the MIX bus selection keys 109-1-109-24 in the bus selection section 100 have been described above as arranged in eight vertical rows and three horizontal rows, they may be arranged in any other suitable manner. For example, the MIX bus selection keys may be arranged in "R" horizontal rows and "S" vertical rows (i.e., R×S MIX bus selection keys), where "P" and "Q" are each an arbitrary natural number greater than one. Further, if "P" and "Q" are each set to an arbitrary natural number greater than two, the overall configuration of the arranged MIX bus selection keys can be closer to a square, which is even more preferable.

(3) In the above-described embodiment, the CUE key 526 is prevented from being interlocked to operation of the SEL key 516 and the CUE key_224 is prevented from being interlocked to operation of the SEL key 222, in view of a situation where the human operator wants to adjust a given MIX output channel in the selected channel control section 300. However, depending on a state of use of the mixing system, it is sometimes preferable that these CUE keys be interlocked to the operation of the SEL keys, and thus the CUE keys may be constructed to be so interlocked.

(4) According to the bus-selection interlocking function in the above-described embodiment, the ON/OFF switching section 80 in the MIX output channel section **36-*k* is interlocked to both of ON and OFF operation of the MIX bus selection key 109-*k*. In an alternative, the ON/OFF switching section 80 may be interlocked to only the ON operation, not to the OFF operation, of the MIX bus selection key 109-*k***.

(5) Further, in the above-described embodiment, the various components of the mixing system are controlled in accordance with the programs stored in the flash memory 12. In an alternative, only such programs may be stored in a recording medium, such as a CD-ROM or flexible disk, and distributed in the recording medium, or distributed through a communication path.

In summary, the present invention is characterized in that, as viewed from the front of the operation panel, the display, selected channel control section and delivery control section are arranged on the operation panel in a row behind the input channel section in the order mentioned and in that the operation of the transmission control section is switched depending on the selected operation mode. Thus, it is possible to efficiently set mixing states of multi-channel signals.

Further, in the present invention, once a given MIX bus is selected during a setting channel selection step, a signal of an output channel corresponding to the given MIX bus is selected as a monitoring signal in response to the bus selection, and a to-be-adjusted channel is automatically selected in the selected channel control section in an interlocked manner to a motoring channel selection step. Thus, it is possible to efficiently set mixing states of multi-channel signals.

What is claimed is:

1. A mixing system comprising:
   a plurality of input channels,
   a plurality of mixing buses for mixing output signals of individual ones of the input channels, and
   a channel selector manual-operator operable by a user to select one of the input channels as a selected input channel;
   a plurality of level operator manual-operators that are provided in individually corresponding relation to the mixing buses so that each level operator manual-operator has its own individual one-to-one corresponding relation to its respective mixing bus distinct from the other one-to-one corresponding relations of the other level operator manual-operators with their respective mixing buses; and a processor configured to:
when a first operation mode in which the plurality of level operator manual-operators are to be used for controlling send levels is selected, cause each of the plurality of level operator manual-operators to be in a respective first function assignment to function as a manual-operator for controlling a send level of the selected input channel to the level operator manual-operator's individually one-to-one corresponding mixing bus, so that each of the respective send levels from the selected input channel to the corresponding mixing bus of the plurality of mixing buses is independently controlled by the respective level operator manual-operator of the plurality of level operator manual-operators; and
when a second operation mode in which the plurality of level operator manual-operators are to be used for controlling output levels of the mixing buses is selected, cause each of the plurality of level operator manual-operators to be in a respective second function assignment to function as a manual-operator for controlling a master volume output level of a mixed signal to be outputted from the level operator manual-operator's individually one-to-one corresponding mixing bus.

2. The mixing system as claimed in claim 1 which further comprises a plurality of ON/OFF state setting manual-operators provided in corresponding relation to the mixing buses,
wherein the processor is further configured to:
when the first operation mode is selected, cause each of the plurality of ON/OFF state setting manual-operators to function as a manual-operator for setting an ON/OFF state of a signal to be supplied from the selected one input channel to a corresponding one of the mixing buses; and
when the second operation mode is selected, cause each of the plurality of ON/OFF state setting manual-operators to function as a manual-operator for setting an ON/OFF state of a signal to be outputted from a corresponding one of the mixing buses.

3. The mixing system as claimed in claim 2 further including an operation panel which comprises:
an input channel panel-section including faders for controlling attenuation rates of the individual input channels and said channel selector manual-operator;
a selected channel control panel-section including an equalizer panel-section for setting contents of an equalizer process for the one input channel selected via the channel selector manual-operator, a compressor panel-section for setting contents of a compressor process for the selected one input channel, and an attenuation manual-operator for setting an input attenuation rate for the selected one input channel;
a bus operator panel-section including said plurality of level operator manual-operators and said plurality of ON/OFF state setting manual-operators; and
a display capable of showing a plurality of display screens including at least a screen for controlling characteristics of the individual input channels,
wherein said input channel panel-section is positioned on said operation panel toward a front of said operation panel, and
wherein said display, said selected channel control panel-section and said bus operator panel-section are positioned in a row and in order mentioned on said operation panel, the row being positioned behind said input channel panel-section.

4. A method of operating a mixing system comprising a plurality of input channels, a plurality of mixing buses for mixing output signals of individual ones of the input channels, a channel selector manual-operator operable by a user to select one of the input channels as a selected input channel, and a plurality of level operator manual-operators that are provided in individually corresponding relation to the mixing buses so that each level operator manual-operator has its own individual one-to-one corresponding relation to its respective mixing bus distinct from the other one-to-one corresponding relations of the other level operator manual-operators with their respective mixing buses, said method comprising:
selecting a first operation mode in which the plurality of level operator manual-operators are in a first function assignment to function as manual-operators for controlling send levels,
controlling, via one of said plurality of level operator manual-operators in the first function assignment, a send level of the selected input channel to a corresponding mixing buses, when the first operation mode is selected, so that a respective send level from the selected input channel to said one level operator manual-operator's individually one-to-one corresponding mixing bus of the plurality of mixing buses is independently controlled by said one level operator manual-operator of the plurality of level operator manual-operators,
selecting a second operation mode in which the plurality of level operator manual-operators are in a second function assignment to function as manual-operators for controlling output levels of the mixing buses, and
controlling, via said one of said plurality of level operator manual-operators in the second function assignment, a master volume output level of a mixed signal to be outputted from said one level operator manual-operator's individually one-to-one corresponding mixing bus, when the second operation mode is selected.

5. A non-transitory machine-readable storage medium containing a program that, when executed by a processor, cause a mixing system to perform a method, the mixing system comprising a plurality of input channels, a plurality of mixing buses for mixing output signals of individual ones of the input channels, a channel selector manual-operator operable by a user to select one of the input channels as a selected input channel, a plurality of level operator manual-operators that are provided in individually corresponding relation to the mixing buses so that each level operator manual-operator has its own individual one-to-one corresponding relation to its respective mixing bus distinct from the other one-to-one corresponding relations of the other level operator manual-operators with their respective mixing buses, and the processor, said method comprising:
selecting a first operation mode in which the plurality of level operator manual-operators are in a first function assignment to function as manual-operators for controlling send levels,
controlling, via one of said plurality of level operator manual-operators in the first function assignment, a send level of the selected input channel to a corresponding mixing buses, when the first operation mode is selected, so that a respective send level from the selected input channel to said one level operator manual-operator's individually one-to-one corresponding mixing bus of the plurality of mixing buses is independently controlled by said one level operator manual-operator of the plurality of level operator manual-operators, selecting a second operation mode in which the plurality of level operator manual-operators are in a second function assignment to function as operators for controlling output levels of the mixing buses, and controlling, via said one of said plurality of level operator manual-operators in the second function assignment, a master volume output level of a mixed signal to be outputted from said one level operator manual-operator's individually one-to-one corresponding mixing bus, when the second operation mode is selected.

* * * * *